(12) United States Patent
Long et al.

(10) Patent No.: US 12,484,376 B2
(45) Date of Patent: Nov. 25, 2025

(54) DISPLAY PANEL AND MANUFACTURING METHOD THEREFOR, DISPLAY SCREEN, AND ELECTRONIC DEVICE

(71) Applicant: Honor Device Co., Ltd., Shenzhen (CN)

(72) Inventors: Haohui Long, Shenzhen (CN); Shanshan Wei, Shenzhen (CN); Jianping Fang, Shenzhen (CN); Xiaolong Li, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 408 days.

(21) Appl. No.: 18/022,392

(22) PCT Filed: Oct. 22, 2021

(86) PCT No.: PCT/CN2021/125897
§ 371 (c)(1),
(2) Date: Feb. 21, 2023

(87) PCT Pub. No.: WO2022/042771
PCT Pub. Date: Mar. 3, 2022

(65) Prior Publication Data
US 2023/0329070 A1    Oct. 12, 2023

(30) Foreign Application Priority Data

Aug. 31, 2020  (CN) .......................... 202010899632.1

(51) Int. Cl.
*H10K 39/12*    (2023.01)
*H10K 59/12*    (2023.01)
(Continued)

(52) U.S. Cl.
CPC ....... *H10K 59/121* (2023.02); *H10K 59/1201* (2023.02); *H10K 59/124* (2023.02);
(Continued)

(58) Field of Classification Search
CPC .. H10K 59/121; H10K 59/1201; H10K 59/40; H10K 59/873; H10K 59/124;
(Continued)

(56) References Cited

U.S. PATENT DOCUMENTS 10,741,788 B2    8/2020  Won et al.
10,861,909 B2   12/2020  Park
(Continued)

FOREIGN PATENT DOCUMENTS

| CN | 110429199 A | * | 11/2019 | ........... G06F 3/0445 |
| CN | 110444576 A |   | 11/2019 | |

(Continued)

*Primary Examiner* — Phuc T Dang
(74) *Attorney, Agent, or Firm* — Leydig, Voit & Mayer, Ltd.

(57) ABSTRACT

This application provides a display panel, a display screen including the display panel, and an electronic device including the display screen. The display panel includes a thin film transistor backplane, an organic layer, and a packaging layer that are successively stacked. The display panel is provided with a through hole, which runs through the thin film transistor backplane, the organic layer, and the packaging layer; the display panel includes a non-display area and a display area, the non-display area being disposed around the through hole and the display area being disposed around the non-display area; the organic layer includes a first organic layer and a second organic layer, the first organic layer is a part located in the display area, and the second organic layer is a part located in the non-display area.

10 Claims, 23 Drawing Sheets

(51) Int. Cl.
  *H10K 59/121* (2023.01)
  *H10K 59/124* (2023.01)
  *H10K 59/40* (2023.01)
  *H10K 59/80* (2023.01)
  *H10K 59/65* (2023.01)
  *H10K 71/00* (2023.01)

(52) U.S. Cl.
  CPC ........... *H10K 59/40* (2023.02); *H10K 59/873* (2023.02); *H10K 59/8731* (2023.02); *H10K 59/8792* (2023.02); *H10K 59/65* (2023.02); *H10K 59/8791* (2023.02); *H10K 71/00* (2023.02)

(58) Field of Classification Search
  CPC .... H10K 59/8791; H10K 59/65; H10K 71/00; H01K 59/8792
  USPC .......................................................... 257/40
  See application file for complete search history.

(56) References Cited

U.S. PATENT DOCUMENTS

| | | |
|---|---|---|
| 11,398,616 B2 | 7/2022 | Ouyang et al. |
| 11,462,714 B2 | 10/2022 | Yun et al. |
| 11,587,989 B2 | 2/2023 | Wu et al. |
| 2017/0237038 A1 | 8/2017 | Kim et al. |
| 2020/0083475 A1* | 3/2020 | Kang ................... H10K 59/124 |
| 2020/0119304 A1 | 4/2020 | Choi et al. |
| 2020/0144535 A1* | 5/2020 | Kim ..................... H10K 59/124 |
| 2020/0168671 A1 | 5/2020 | Jang et al. |
| 2020/0212139 A1 | 7/2020 | Baek et al. |

FOREIGN PATENT DOCUMENTS

| | | |
|---|---|---|
| CN | 110600511 A | 12/2019 |
| CN | 111081732 A | 4/2020 |
| CN | 111129351 A | 5/2020 |
| CN | 111162195 A | 5/2020 |
| CN | 111326553 A | 6/2020 |
| CN | 111403624 A | 7/2020 |
| CN | 111443774 A | 7/2020 |
| KR | 1020200025916 A | 3/2020 |

* cited by examiner

DISPLAY PANEL AND MANUFACTURING METHOD THEREFOR, DISPLAY SCREEN, AND ELECTRONIC DEVICE

CROSS-REFERENCE TO RELATED APPLICATIONS

This application is a national stage of International Application No. PCT/CN2021/125897, filed on Oct. 22, 2021, which claims priority to Chinese Patent Application No. 202010899632.1, filed on Aug. 31, 2020. The disclosures of both of the aforementioned applications are hereby incorporated by reference in their entireties.

TECHNICAL FIELD

This application relates to the field of terminal devices, and in particular, to a display panel and a manufacturing method therefor, a display screen, and an electronic device.

BACKGROUND

A hole-punch screen is a design that can increase the screen ratio of a mobile phone. A hole-punch screen means that a through hole is punched on a display panel (commonly known as "hole punch" in the industry) and a front camera is aligned with the through hole. In order to prevent external water and oxygen from entering a display area of the display panel from the through hole, an outer circumference of the through hole is surrounded by an isolation column, which isolates the through hole from the display area of the display panel. However, the structure of the isolation column is complex, which leads to the high manufacturing cost of the display panel.

SUMMARY

This application provides a display panel and a manufacturing method therefor, a display screen, and an electronic device, which can isolate water and oxygen from a through hole with a relatively simple structure, thereby reducing the manufacturing cost.

In a first aspect, this application provides a display panel, which can be laminated to a cover plate. The display panel includes a thin film transistor backplane, an organic layer, and a packaging layer that are successively stacked; the display panel is provided with a through hole, which runs through the thin film transistor backplane, the organic layer, and the packaging layer; the display panel includes a non-display area and a display area, the non-display area being disposed around the through hole and the display area being disposed around the non-display area; the organic layer includes a first organic layer and a second organic layer, the first organic layer is a part located in the display area, and the second organic layer is a part located in the non-display area, where the first organic layer includes a plurality of display units, the second organic layer is provided with a first groove, which runs through the second organic layer, and the first groove is disposed around the through hole; and the packaging layer covers the organic layer and is filled in the first groove.

In this application, the thin film transistor backplane may be used as a carrying backplane of the organic layer. The thin film transistor backplane may include a substrate and a thin film transistor array formed on the substrate. The display area and the non-display area are divided based on the overall area of the display panel, and all the stacked layers in the display panel such as the thin film transistor backplane, the organic layer, and the packaging layer each have a part located in the display area and a part located in the non-display area. The non-display area surrounds the through hole by one round, and the shape of the non-display area can be adapted to the shape of the through hole. The display area surrounds an outer circumference of the non-display area. Because the first organic layer in the organic layer can emit light to implement image display, the area where the first organic layer is located can also be considered as the display area. The display unit is a pixel, and one display unit may include one red sub-pixel R, one green sub-pixel G, and one blue sub-pixel B. Each display unit can emit a light ray, so that the display panel implements image display. The first groove surrounds the through hole by one round. The packaging layer is configured to package and protect the organic layer which is apt to be invaded by an external environment (such as water and oxygen), and the packaging layer may be made of a material with stable properties (such as an inorganic material, or an organic materials plus an inorganic material). The packaging layer may be made, for example, by a thin film packaging process. A part of the material of the packaging layer is filled in the first groove, to partition the second organic layer.

In the solution of this application, the first groove is provided at the part of the organic layer which is located in the non-display area, and the packaging layer is filled in the first groove to partition the organic layer, so that external water and oxygen entering from the through hole can be blocked at the first groove, and the external water and oxygen can be prevented from invading the display area along the organic layer. Because the structure of the first groove is simple and easy to process, the manufacturing cost is low.

According to a possible implementation of the first aspect, a width of the first groove on a side close to the packaging layer is greater than the width of the first groove on a side away from the packaging layer. Such the first groove has a trapezoidal cross section, which facilitates full deposition of the material of the packaging layer in the first groove and ensures a partition effect for the organic layer.

According to a possible implementation of the first aspect, the thin film transistor backplane includes a substrate and a dam disposed on the substrate, the dam being located in the non-display area and disposed around the through hole; the organic layer covers the substrate and the dam, and the first groove is spaced apart from the dam; the packaging layer includes a first inorganic packaging layer, an organic packaging layer, and a second inorganic packaging layer; the first inorganic packaging layer covers the organic layer and is filled in the first groove; the organic packaging layer covers a part of the first inorganic packaging layer located on an outer circumference of the dam; and the second inorganic packaging layer covers the organic packaging layer and the first inorganic packaging layer.

In this implementation, the substrate is a base film for forming a packaging layer and an organic layer. The substrate may be formed by stacking a plurality of layers of materials. The dam may be spaced apart from the thin film transistor array mentioned above. The dam surrounds the through hole by one round. The position relationship between the dam and the first groove may be designed as needed, for example, the dam may surround an outer side of the first groove, the first groove may surround an outer side of the dam, or the first groove is provided in both inner and outer sides of the dam. The dam is configured to block the organic packaging material in the organic packaging layer (the organic packaging material is easy to flow) and prevent the organic packaging material from crossing a designed position. The first inorganic packaging layer may be made of an inorganic material, such as SiNx and/or SiO2. The first inorganic packaging layer is filled in the first groove and partitions the organic layer. The organic packaging layer may be made of an organic material such as an epoxy resin type organic material and polymethyl methacrylate. The second inorganic packaging layer may be made of an inorganic material, such as SiNx and/or SiO2. Such the "sandwich" structure composed of the first inorganic packaging layer, the organic packaging layer, and the second inorganic packaging layer has a good packaging performance.

According to a possible implementation of the first aspect, first grooves are provided in both the inner and outer sides of the dam, and all of the first grooves are in the non-display area. Such the design can strengthen the isolation effect of the first groove for water and oxygen, and ensure that water and oxygen cannot invade the display area. According to a possible implementation of the first aspect, the width of the first groove on the side close to the packaging layer is 10 μm-50 μm and the width of the first groove on the side away from the packaging layer is 10 μm-50 μm. Such the design makes the overall width of the first groove extremely small, so that the non-display area can have a small width, and therefore the opaque area in the cover plate can also be made narrow, thereby being beneficial to increase of the screen ratio of an electronic device.

According to a possible implementation of the first aspect, the substrate is provided with a second groove, which forms an opening on a surface of the substrate facing the organic layer, where the second groove does not run through the substrate and the second groove is located between the dam and the through hole and surrounds the through hole; and the first groove is located on an outer circumference of the second groove.

In this implementation, the second groove surrounds the through hole by one round. Among the dam, the first groove, and the second groove, the second groove is closest to the through hole. Stress concentration may occur near the through hole, resulting in a crack in the display panel. The design of the second groove can prevent the crack from extending from the through hole to the display area, thereby avoiding damage to the display area and ensuring the reliability of the display area.

According to a possible implementation of the first aspect, the display panel includes a touch layer, which covers the packaging layer; and the through hole runs through the touch layer. The touch layer includes touch units arranged in an array and configured to implement a touch operation of the display panel. The touch layer may be located on the side of the packaging layer away from the organic layer, for example, the touch layer may be laminated to the packaging layer through an adhesive layer. Alternatively, the touch layer may be integrated with the packaging layer, that is, the touch layer is formed together in the manufacturing process of the display panel (the touch layer may be used as a composition of the display panel), instead of laminating an independent touch layer to the packaging layer. The design of integrating the touch layer with the packaging layer can reduce the overall thickness of the display panel.

In a second aspect, this application provides a display screen, including a cover plate and the display panel according to any one of the above, where the cover plate is laminated to the display panel and a packaging layer is located between the cover plate and an organic layer. The cover plate is hard in texture and may provide touch sense and a force feedback to a user when the user touches it. The cover plate may be a rigid cover plate, which cannot be bent and can be applied to a rigid display screen. Alternatively, the cover plate may be a flexible cover plate, which is easy to bend and can be applied to a folding display screen. The cover plate can be bonded to the display panel. All areas of the cover plate can transmit light; or a part of the cover plate is opaque and the opaque area of the cover plate positionally corresponds to a non-display area of the display panel.

According to a possible implementation of the second aspect, the cover plate includes a first transparent area, an opaque area, and a second transparent area, where the first transparent area is disposed around the opaque area and the opaque area is disposed around the second transparent area; and the display area is located in the first transparent area, the opaque area corresponds to the non-display area, and the second transparent area corresponds to the through hole. The first transparent area surrounds an outer circumference of the opaque area and the opaque area surrounds an outer circumference of the second transparent area. The opaque area may be formed by coating light-shielding ink on a surface of the cover plate facing the display panel, and the other area of the cover plate may be divided into a first transparent area and a second transparent area. Therefore, a light ray emitted by the display panel can be emitted from the first transparent area of the cover plate, so that the user can watch a picture. An external light ray can pass through the second transparent area and enter the through hole. The opaque area on the cover plate can cover the non-display area of the display panel to ensure the simple appearance of the display screen.

According to a possible implementation of the second aspect, a boundary of the opaque area and the second transparent area falls within a boundary of the through hole. The boundary refers to a border between the opaque area and the second transparent area, and the border is located inside the through hole. That is, the opaque area extends to an inner side of the through hole. Such the design can ensure the blocking effect of the opaque area on the non-display area, and avoid the situation that the non-display area is not completely blocked and exposed due to manufacturing errors or assembly errors.

In a third aspect, this application provides an electronic device, including an optical module and the display screen according to any one of the above, where the optical module corresponds to the through hole and the optical module is configured to acquire a light ray passing through the second transparent area and the through hole.

In this application, the optical module is configured to sense an external light ray, to generate an electrical signal. After being processed by an electronic device, the electrical signal can be converted into target information. The optical module includes, but is not limited to, at least one of a camera module, an infrared lens, a dot matrix projector, a distance sensor, an ambient light sensor, a proximity light sensor, or the like. The correspondence between the optical module and the through hole means that the positions of the optical module and the through hole can be close, to ensure that the optical module can acquire a light ray passing through the through hole. The optical module 13 is disposed inside the through hole, to ensure that an optical module 13 can acquire more light rays passing through a through hole 15c, and the camera module may alternatively be disposed outside the through hole 15c, to ensure that light rays pass through the camera module to form an image. For example, the optical module and the through hole may be aligned, that is, in an axial direction of the through hole, a projection of the optical module overlaps with a projection of the through hole. It may also mean that an optical axis of the optical module substantially coincides with an axis of the through hole 15c, and errors are allowed, as long as the light rays can pass through the camera module to form an image. The electronic device of this application not only has a low manufacturing cost, but also has a large screen ratio.

In a fourth aspect, this application provides a method for manufacturing a display panel, including: manufacturing a thin film transistor backplane; forming an organic layer on the thin film transistor backplane, where the organic layer includes a first organic layer and a second organic layer, the first organic layer is disposed around the second organic layer, the first organic layer includes a plurality of display units, the first organic layer serves as a display area of the display panel, the second organic layer does not include a display unit, and the second organic layer serves as a non-display area of the display panel; forming a first groove around the second organic layer by one round, so that the first groove runs through the second organic layer; forming a packaging layer on the organic layer, so that the packaging layer covers the first organic layer and the second organic layer and is filled in the first groove; forming a touch layer and a polarizing layer on the packaging layer, so that the touch layer is located between the packaging layer and the polarizing layer, to prepare a prefabricated panel; and forming a through hole in the prefabricated panel, so that the through hole is provided on an inner side of the first groove.

In this application, the first organic layer can emit light to cause the display panel to display an image, the area where the first organic layer is located may be referred to as a display area, and therefore, forming of the first organic layer is forming of the display area. Correspondingly, the second organic layer cannot emit light, the area where the second organic layer is located may be referred to as a non-display area, and therefore, forming of the second organic layer is forming of the non-display area. The through hole runs through all stacked layers of a prefabricated panel. The first groove surrounds an outer circumference of the through hole. In the solution of this application, the first groove is provided at the part of the organic layer which is located in the non-display area, and the packaging layer is filled in the first groove to partition the organic layer, so that external water and oxygen entering from the through hole can be blocked at a packaging groove, and the external water and oxygen can be prevented from invading the display area along the organic layer. Because the structure of the packaging groove is simple and easy to process, the manufacturing cost is low.

According to a possible implementation of the fourth aspect, the forming a first groove around the second organic layer by one round includes: forming the first groove by laser etching. A basic principle of laser etching is to focus a low-power laser beam with high beam quality (for example, may be ultraviolet laser, fiber laser, or the like) into an extremely small light spot, and form an extremely high power density at the focus, so that a material of the second organic layer vaporizes and evaporates instantly, to form the first groove. Laser etching has a small heat affected zone, can ablate the machining area quite accurately, has an extremely high machining accuracy and machining quality, and therefore can etch the first groove having an extremely small width. This is beneficial to reduce the width of the non-display area, so that the opaque area on the cover plate can be made narrow, thereby being beneficial to increase of the screen ratio of an electronic device. Moreover, because the laser etching can focus into an extremely small light spot at a laser wavelength level, the second organic layer can be completely etched away, which is beneficial to the filling of the packaging layer. In addition, the laser etching is suitable for processing a flexible material without contact with and contamination of the second organic layer.

According to a possible implementation of the fourth aspect, in the step of forming a first groove around the second organic layer by one round, so that the first groove runs through the second organic layer, a width of the first groove on a side away from the thin film transistor backplane is greater than the width of the first groove on a side close to the thin film transistor backplane. Such the first groove has a trapezoidal cross section, which facilitates full deposition of the material of the packaging layer in the first groove and ensures a partition effect for the organic layer.

According to a possible implementation of the fourth aspect, the "manufacturing a thin film transistor backplane" includes: manufacturing a substrate; and forming a dam around the substrate by one round. In the step of forming an organic layer on the thin film transistor backplane, the first organic layer is enabled to cover the substrate and the second organic layer is enabled to cover the substrate and the dam. In the step of forming a first groove surrounding the second organic layer by one round, so that the first groove runs through the second organic layer, the dam is disposed around the first groove. The forming a packaging layer on the organic layer, so that the packaging layer covers the first organic layer and the second organic layer and is filled in the first groove includes: forming a first inorganic packaging layer on the organic layer, so that the first inorganic packaging layer covers the first organic layer and the second organic layer and is filled in the first groove; forming an organic packaging layer on the first inorganic packaging layer, so that the organic packaging layer covers a part of the first inorganic packaging layer located on an outer circumference of the dam; and forming a second inorganic packaging layer, so that the second inorganic packaging layer covers the organic packaging layer and the first inorganic packaging layer. The forming a touch layer and a polarizing layer on the packaging layer includes: forming the touch layer and the polarizing layer on the second inorganic packaging layer. Through the implementation, a "sandwich" structure composed of a first inorganic packaging layer, an organic packaging layer, and a second inorganic packaging layer can be prepared, and such the packaging layer of the "sandwich" structure has a good packaging performance.

According to a possible implementation of the fourth aspect, in the step of forming a first groove around the second organic layer by one round, so that the first groove runs through the second organic layer, at least two first grooves are provided, so that at least one of the first grooves is located on an inner circumference of the dam and that the rest of the first grooves are disposed around an outer circumference of the dam. Through this implementation, first grooves are formed in both the inner and outer sides of the dam, which can strengthen the isolation effect of the first groove for water and oxygen, and ensure that the water and oxygen cannot invade the display area.

According to a possible implementation of the fourth aspect, the forming an organic packaging layer on the first inorganic packaging layer, so that the organic packaging layer covers a part of the first inorganic packaging layer located on an outer circumference of the dam includes: printing an organic material on the part of the first inorganic packaging layer located on the outer circumference of the dam by ink jet printing; and curing the organic material to obtain the organic packaging layer. An ink jet printing process has a low cost and high reliability.

According to a possible implementation of the fourth aspect, the width of the first groove on the side away from the thin film transistor backplane is 10 μm-50 μm and the width of the first groove on the side close to the thin film transistor backplane is 10 μm-50 μm. Such the design makes the overall width of the first groove extremely small, so that the non-display area can have a small width, and therefore the opaque area in the cover plate can also be made narrow, thereby being beneficial to increase of the screen ratio of an electronic device.

According to a possible implementation of the fourth aspect, between the manufacturing a thin film transistor backplane and the forming an organic layer on the thin film transistor backplane, the manufacturing method further includes: forming a second groove surrounding the thin film transistor backplane by one round, where the second groove does not run through the thin film transistor backplane. In the step of forming an organic layer on the thin film transistor backplane, the second organic layer is filled in the second groove. In the step of forming a first groove surrounding the second organic layer by one round, so that the first groove runs through the second organic layer, the first groove is provided around the second groove. In the step of forming a through hole in the prefabricated panel, so that the through hole is provided on an inner side of the first groove, the through hole is located on an inner side of the second groove.

In this implementation, the second groove surrounds the through hole by one round. Among the dam, the first groove, and the second groove, the second groove is closest to the through hole. Stress concentration may occur near the through hole, resulting in a crack in the display panel. The design of the second groove can prevent the crack from extending from the through hole to the display area, thereby avoiding damage to the display area and ensuring the reliability of the display area.

According to a possible implementation of the fourth aspect, the manufacturing a thin film transistor backplane includes: providing a rigid carrier plate; forming at least two layers of organic polymer materials and at least two layers of inorganic materials on the rigid carrier plate, so that the at least two layers of organic polymer materials and the two layers of inorganic materials are alternately stacked, where one layer of the organic polymer material is laminated to the rigid carrier plate, to prepare the substrate. Between the forming a packaging layer on the organic layer, so that the packaging layer covers the first organic layer and the second inorganic layer and is filled in the first groove and the forming a touch layer and a polarizing layer on the packaging layer, so that the touch layer is located between the packaging layer and the polarizing layer, to obtain the prefabricated panel, or between the forming a touch layer and a polarizing layer on the packaging layer, so that the touch layer is located between the packaging layer and the polarizing layer, to obtain the prefabricated panel and the providing a through hole on the prefabricated panel, so that the through hole is located on an inner side of the first groove, the manufacturing method further includes: lifting off the rigid carrier plate. This implementation is used for manufacturing a flexible and easy-to-bend substrate. A display panel having such a flexible substrate can be used in a folding display screen.

According to a possible implementation of the fourth aspect, the forming a touch layer and a polarizing layer on the packaging layer includes: forming the touch layer on the packaging layer; and forming the polarizing layer on the touch layer through a coating process. In the coating process, a polarizing liquid is coated on the touch layer, and then the polarizing liquid is cured, to obtain a polarizing layer. A polarizer prepared in this method is thin, which is beneficial to reduce the overall thickness of the display panel.

In a fifth aspect, this application provides a display screen, including a display panel, which is manufactured by the manufacturing method according to the implementations of the fourth aspect.

In a sixth aspect, this application provides an electronic device, including a display panel, which is manufactured by the manufacturing method according to the implementations of the fourth aspect.

DESCRIPTION OF EMBODIMENTS

The following embodiment of this application provides an electronic device, including, but not limited to, a mobile phone, a tablet computer, a vehicle-mounted device (for example, a car machine), a wearable device (for example, a smart watch, a virtual reality device, an augmented reality device), a smart screen device, and the like. The electronic device is provided with a display screen. A mobile phone is used as an example for description of the electronic device in the following.

Figure 1:
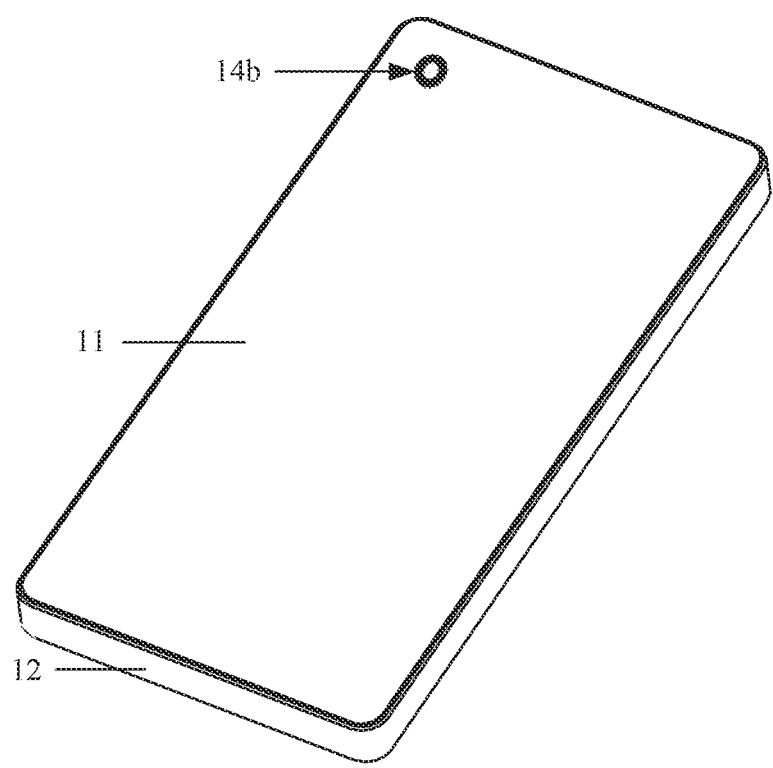
FIG. 1 is a schematic view of a three-dimensional structure of an electronic device according to Embodiment 1.
Figure 2:
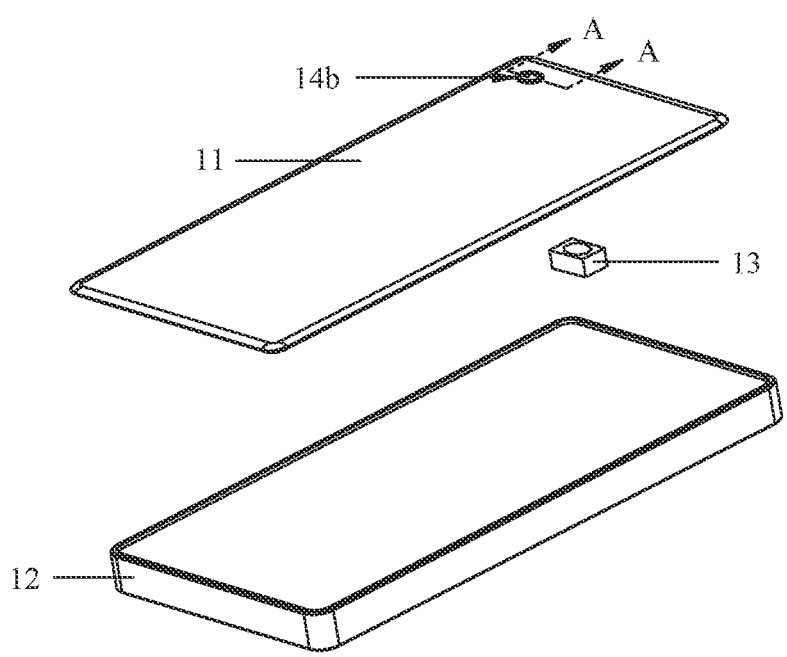
FIG. 2 is a schematic view of an exploded structure of the electronic device of FIG. 1.

As shown in FIG. 1 and FIG. 2, an electronic device 10 of Embodiment 1 may include a shell 12, an optical module 13, and a display screen 11.

The shell 12 serves as a structural bearing member of the electronic device 10 for mounting the display screen 11 and the optical module 13 and for accommodating or mounting other components (for example, a circuit board assembly). The shell 12 may be an assembly. The key design of this embodiment of this application does not lie in the shell 12 and the specific structure of the shell 12 is not limited.

The display screen 11 may be a flat screen, that is, the display screen 11 has a flat plate shape, an edge of which is not curved to form a cambered surface. Alternatively, the display screen 11 may be a curved screen, an edge of which is curved to form an arc surface. On the other hand, the display screen 11 may be a rigid screen that cannot be bent or may be a foldable screen that can be folded.

Figure 3:
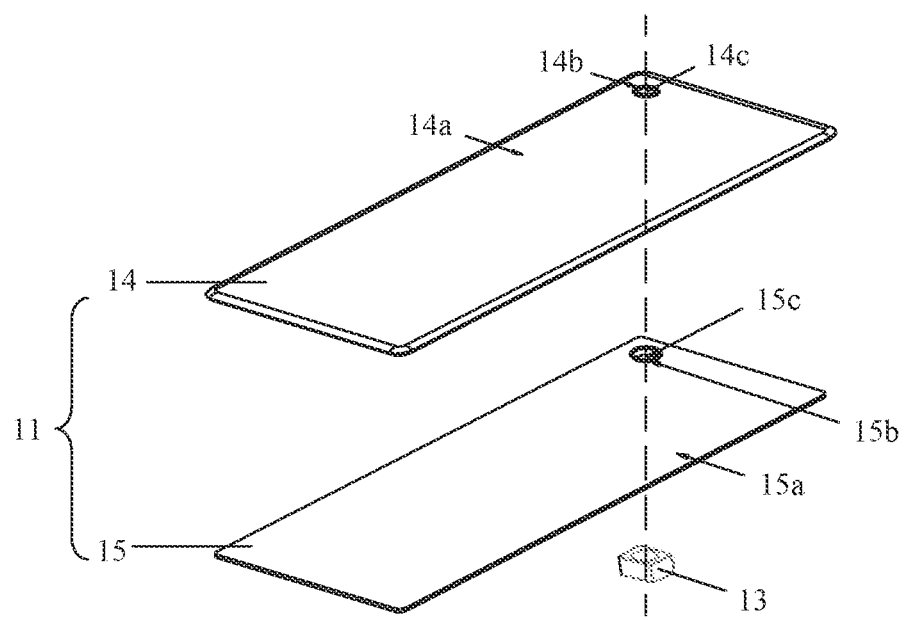
FIG. 3 is a schematic view of an exploded structure of a display screen of the electronic device of FIG. 2.

As shown in FIG. 2 and FIG. 3, the display screen 11 may include a cover plate 14 and a display panel 15, the cover plate 14 is laminated to the display panel 15, and the display panel 15 is enclosed by the cover plate 14 and the shell 12. The cover plate 14 is configured to protect the display panel 15. The cover plate 14 is hard in texture and may provide touch sense and a force feedback to a user when the user touches it. The cover plate 14 may be a rigid cover plate, which cannot be bent, and such the cover plate 14 can be applied to a rigid display screen. Alternatively, the cover plate 14 may be a flexible cover plate, which is easy to bend, and such the cover plate 14 can be applied to a foldable screen.

Figure 4:
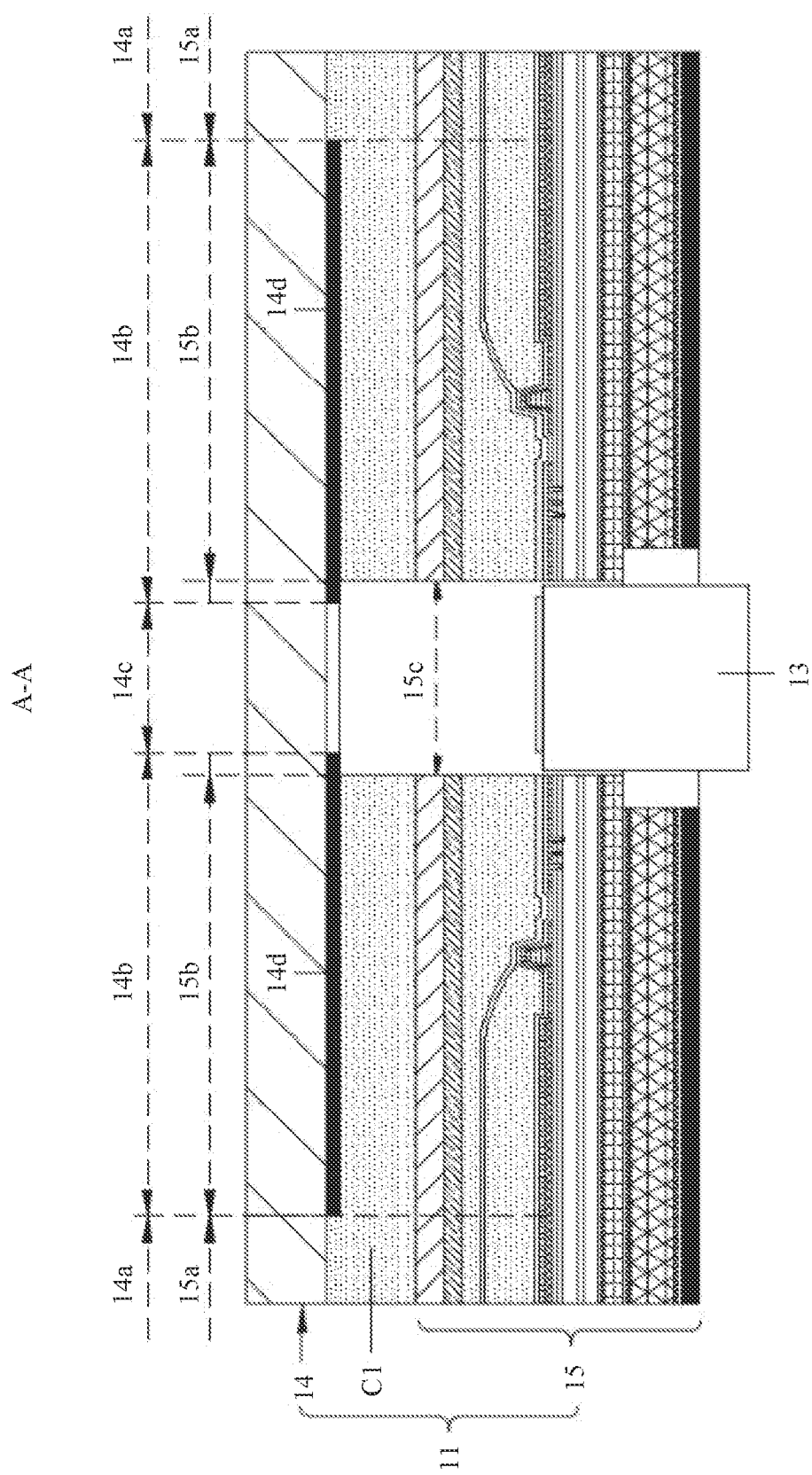
FIG. 4 illustrates a sectional structure of a display screen of the electronic device along A-A in FIG. 2 and a schematic assembly relationship between the display screen and an optical module in the electronic device.

As shown in FIG. 3 and FIG. 4 (FIG. 4 is a schematic sectional view of the display screen 11 along A-A in FIG. 2, which may illustrate a position relationship between the cover plate 14 and the display panel 15), the cover plate 14 may be provided with a first transparent area 14a, an opaque area 14b, and a second transparent area 14c. The second transparent area 14c may be approximately a circular area. The second transparent area 14c allows transmission of an external light ray and facilitates reception of the external light ray by the optical module 13 (which is continuously described below). The opaque area 14b surrounds an outer circumference of the second transparent area 14c (that is, surrounding by one round, hereinafter the same), to form an approximately circular area. A light ray cannot pass through the opaque area 14b, so that a structure of the display panel 15 located below the opaque area 14b is blocked from being visible (which is continuously described below). The opaque area 14b and the second transparent area 14c may be close to an edge of the cover plate 14, for example, at a corner of the cover plate 14 or at a middle of one edge. If the cover plate 14 is a curved cover plate, both the opaque area 14b and the second transparent area 14c are located in a flat portion of the curved cover plate. The first transparent area 14a surrounds the outer circumference of the second transparent area 14c, and an outer boundary of the first transparent area 14a may substantially extend to a circumference of the cover plate 14, that is, the first transparent area 14a may substantially be an area of the cover plate 14 apart from the opaque area 14b and the second transparent area 14c. The first transparent area 14a allows a light ray emitted by the display panel 15 to pass through, so that a user can see a picture (which is continuously described below). The shapes of the opaque area 14b and the second transparent area 14c are merely an example and this embodiment of this application is not limited thereto. For example, the second transparent area 14c may be approximately an elliptical area (similar to an elliptical runway) and the opaque area 14b may be an elliptical ringlike area.

As shown in FIG. 4, in Embodiment 1, light-shielding ink 14d may be coated on a partial surface of the cover plate 14 facing the display panel 15, to manufacture an opaque area 14b. In FIG. 4, a black area on the surface of the cover plate 14 facing the display panel 15 represents the light-shielding ink 14d. Certainly, this is merely an example and the opaque area 14b may actually be formed in other manners. Alternatively, unlike Embodiment 1, the cover plate in another embodiment is not coated with the light-shielding ink 14d and the entire area of the cover plate is transparent. Such the cover plate does not shield the structure of the display panel 15, so that a user can observe all areas of the display panel 15, which can produce a unique appearance experience.

In Embodiment 1, the display panel 15 may be flexible and easy to bend, that is, the display panel 15 may be a flexible display panel. The display panel 15 includes, but is not limited to, an organic light emitting diode (OLED) panel, a quantum dot light emitting diode (QLED) panel, and the like. The display panel 15 is configured to display an image. Light rays emitted by the display panel 15 may be emitted from the first transparent area 14a, so that a user can see an image in the first transparent area 14a.

As shown in FIG. 3 and FIG. 4, the display panel 15 includes a through hole 15c, a non-display area 15b, and a display area 15a. The through hole 15c runs through the display panel 15 and an axis of the through hole 15c may be along a thickness direction of the display panel 15. The shape of the through hole 15c may be similar to that of the second transparent area 14c, for example, the through hole 15c is a round hole or an elliptical hole. A quantity of the through holes 15c is at least one. FIG. 3 illustrates one through hole 15c, which is merely an example. There may be two or more through holes 15c according to product requirements and these through holes may be located at different positions and may be spaced apart from each other.

As shown in FIG. 4, the through hole 15c may positionally correspond to the second transparent area 14c, and positionally corresponding means that at least a part of a projection of the through hole 15c on the cover plate 14 falls within the second transparent area 14c in the thickness direction of the cover plate 14. Therefore, an external light ray can pass through the second transparent area 14c and enter the through hole 15c. For example, as shown in FIG. 4, the through hole 15c may be aligned with the second transparent area 14c and axes of the through hole 15c and the second transparent area 14c may substantially coincide. A diameter of the through hole 15c may be greater than a diameter of the second transparent area 14c, that is, an inner boundary of the opaque area 14b may exceed a boundary of the through hole 15c, to block a partial area of the through hole 15c (the advantages of this design is described below). Alternatively, the through hole 15c may be aligned with the second transparent area 14c, axes of the through hole 15c and the second transparent area 14c may be substantially coincide, and diameters thereof may also be substantially identical. The through hole 15c is aligned with the optical module 13, for an external light ray passing through the second transparent area 14c to pass through, so that the optical module 13 can receive the external light ray.

As shown in FIG. 3 and FIG. 4, in the display panel 15, an outer edge of the through hole 15c is a non-display area 15b, which surrounds the through hole 15c by one round. The shape of the non-display area 15b matches the shape of the through hole 15c. For example, the non-display area 15b may be approximately circular or elliptical. The non-display area 15b is an area in which a packaging groove 157a (that is, the first groove 157a, referred to as the packaging groove 157a in this embodiment of this application for the sake of readability, hereinafter the same), a barrier dam 168 (that is, the dam 168, referred to as the barrier dam 168 in this embodiment of this application for the sake of readability, hereinafter the same), and a crack arrest groove 159a (that is, the second groove 159a, referred to as the crack arrest groove 159a in this embodiment of this application for the sake of readability, hereinafter the same) are located. The non-display area 15b has no pixels, cannot emit light, and does not display an image.

As shown in FIG. 4, the non-display area 15b positionally corresponds the opaque area 14, and positionally corresponding means that in the thickness direction of the cover plate 14, at least a part of a projection of the non-display area 15b on the cover plate 14 falls within the opaque area 14b, and the at least part is blocked from being visible by the opaque area 14b. For example, the projection of the non-display area 15b in FIG. 4 may all fall into the opaque area 14b, so that all of the non-display area 15b is blocked by the opaque area 14b.

In FIG. 4, an inner boundary of the opaque area 14b (the opaque area 14b is a closed ringlike area whose inner boundary is referred to as an inner boundary and whose outer boundary is referred to as an outer boundary; it can also be understood that a boundary close to the second transparent area 14c is an inner boundary and a boundary far away from the second transparent area 14c is referred to as an outer boundary; and the meanings of inner boundary and outer boundary mentioned below follow this definition) may exceed an inner boundary of the non-display area 15b (that is, exceeding a boundary of the through hole 15c), which can ensure the blocking effect of the opaque area 14b on the non-display area 15b, and avoid the situation that the non-display area 15b is not completely blocked and exposed out of the second transparent area 14c due to manufacturing errors or assembly errors. The outer boundary of the opaque area 14b in FIG. 4 may be substantially aligned with the outer boundary of the non-display area 15b, so that the opaque area 14b may be prevented from blocking the display area 15a. The positional design of the opaque area 14b and the non-display area 15b is merely an example and this embodiment of this application is not limited thereto. For example, the inner boundary of the opaque area 14b may be substantially aligned with the inner boundary of the non-display area 15b and the outer boundary of the opaque area 14b may exceed the outer boundary of the non-display area 15b.

As shown in FIG. 3 and FIG. 4, in the display panel 15, the other areas except the display area 15b and the through hole 15c may substantially be the display area 15a, which surrounds the outer circumference of the non-display area 15b. The display area 15a has pixels that can emit light. Light rays emitted by the display area 15a may be emitted from the first transparent area 14a, to form an image.

As shown in FIG. 4, the display area 15a is located in the first transparent area 14a, that is, in the thickness direction of the cover plate 14, a projection of the display area 15a on the cover plate 14 entirely falls within the first transparent area 14a, so that light rays from the entire display area 15a can be emitted from the first transparent area 14a. For example, the display area 15a in FIG. 4 may be substantially overlapped with the first transparent area 14a. Alternatively, at least a part of the boundary of the display area 15a may be retracted within the corresponding boundary of the first transparent area 14a according to product requirements.

In Embodiment 1, when there are a plurality of the through holes 15c, there may also be a plurality of the second transparent areas 14c and one second transparent area 14c corresponds to one through hole 15c. Correspondingly, there may be a plurality of the opaque areas 14b and one opaque area 14b surrounds one second transparent area 14c. If adjacent second transparent areas 14c are close to each other, the opaque areas 14b corresponding to the second transparent areas 14c may be connected to form a large opaque area. Alternatively, the opaque areas 14b corresponding to the second transparent areas 14c may be spaced apart from each other. The first transparent area 14a surrounds an outer circumference of all the opaque areas 14b.

Figure 5:
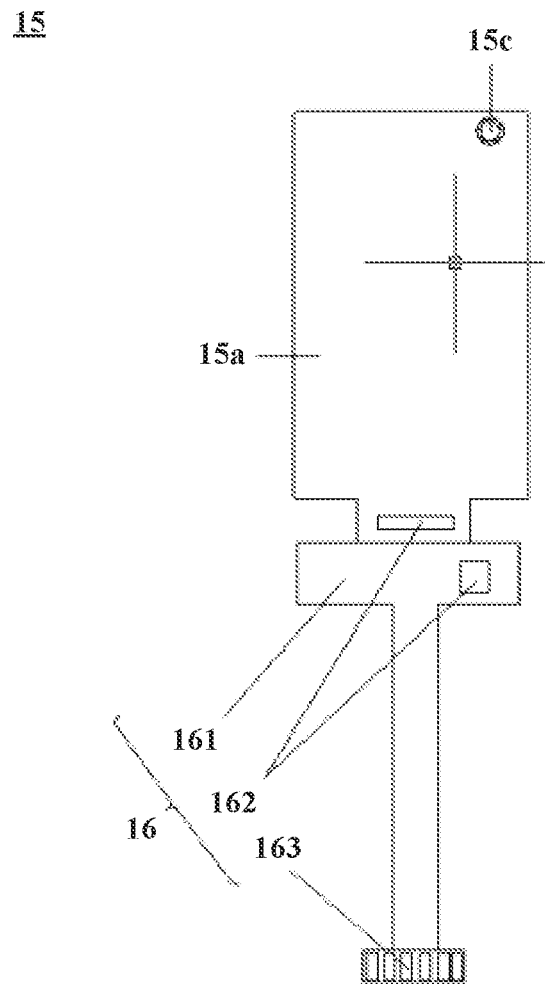
FIG. 5 is a schematic structural diagram of a back surface of the display panel of the display screen in FIG. 3.

FIG. 5 illustrates a top view schematic structure of the display panel 15. As shown in FIG. 5, the display panel 15 may further include a flexible circuit board (flexible printed circuit, FPC) assembly 16. The flexible circuit board assembly 16 may include a flexible circuit board 161 and a device 162 and a connector 163 disposed on the flexible circuit board 161. The flexible circuit board 161 may extend from an edge of the display area 15a of the display panel 15 and is electrically connected to a thin film transistor (TFT) array layer 158 (which is described below) in the display panel 15. The device 162 may be soldered to a surface of the flexible circuit board 161, and the device 162 includes, but is not limited to, an integrated circuit (IC). A connector 163 may be disposed at an end portion of the flexible circuit board 161 and configured to be connected to a circuit board of the electronic device 10, to implement electrical connection between the display panel 15 and the circuit board.

The foregoing literal description of the display panel 15 describes an external macro structure of the display panel 15. The following continuously describes an internal stacked structure of the display panel 15.

The optical module 13 is configured to sense an external light ray, to generate an electrical signal. After being processed by the electronic device 10, the electrical signal can be converted into target information. The optical module 13 includes, but is not limited to, at least one of a camera module, an infrared lens, a dot matrix projector, a distance sensor, an ambient light sensor, a proximity light sensor, or the like. The optical module 13 in FIG. 2 and FIG. 3 is a camera module, which is merely an example and is not a limitation to this embodiment of this application.

Referring to FIG. 2 and FIG. 3, the optical module 13 may be mounted on the shell 12 and located between the cover plate 14 and the shell 11. In an implementation, as shown in FIG. 3, the optical module 13 may be entirely located between the display panel 15 and the shell 12, that is, the optical module 13 may be entirely below the display panel 15 ("below" is based on the perspective in FIG. 3), namely, the optical module 13 is entirely outside the through hole 15c. In another implementation, as shown in FIG. 4, one part of the optical module 13 may be located inside the through hole 15c and the other part is located outside the through hole 15c. Alternatively, in other implementations, the optical module 13 may be entirely accommodated within the through hole 15c.

In this embodiment of this application, the optical module 13 may correspond to the through hole 15c, to acquire an external light ray entering the through hole 15c. In FIG. 3, a dashed line passing through the second transparent area 14c, the through hole 15c, and the optical module 13 is used to represent a correspondence that the through hole 15c corresponds to the second transparent area 14c and the optical module 13 corresponds to the through hole 15c. For example, the optical module 13 is a camera module. That the optical module 13 corresponds to the through hole 15c may mean that an optical axis of the camera module coincides with an axis of the through hole 15c, or may mean that an optical axis of the optical module substantially coincides with an axis of the through hole 15c, and errors are allowed, as long as light rays can pass through the camera module to form an image. Certainly, the position relationship between the optical module 13 and the through hole 15c is not limited to the foregoing description. Optionally, the optical module 13 positionally corresponds to the through hole 15c, the positions of the optical module 13 and the through hole 15c can be near, and the optical module 13 is disposed inside the through hole, to ensure that the optical module 13 can acquire more light rays passing through the through hole 15c. The camera module may alternatively be disposed outside the through hole 15c, as long as it can be ensured that light rays pass through the camera module can form an image.

Figure 6:
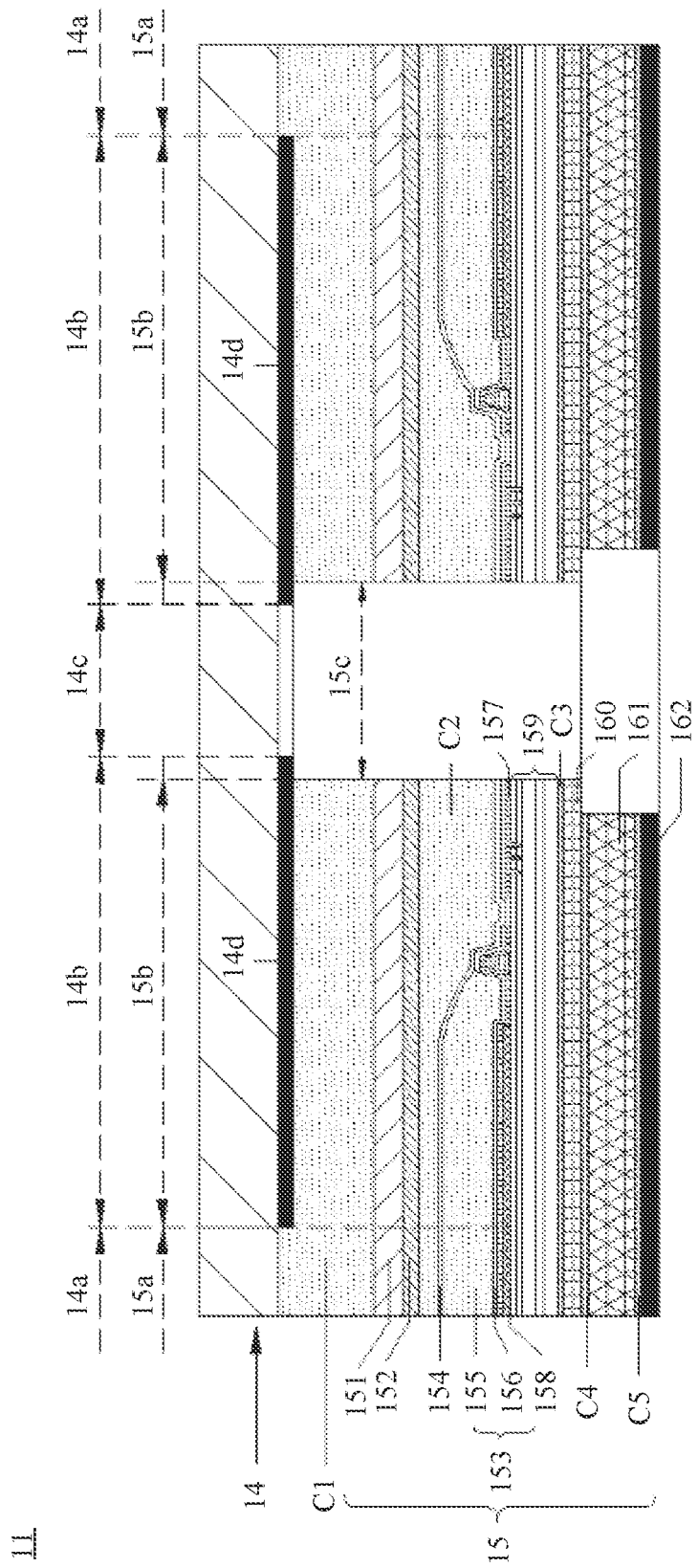
FIG. 6 is a schematic sectional view of the display screen of the electronic device along A-A in FIG. 2.

FIG. 6 illustrates an internal stacked structure of the display panel 15 in a sectional view. For the purpose of clarity of the drawings, not all the contours of the stacked layers in the area of the through hole 15c are displayed, hereinafter the same.

As shown in FIG. 6, the display panel 15 may include a polarizer 151, a touch layer 152, a packaging layer 153, and an organic functional layer 157 (that is, the organic layer 157, referred to as the organic functional layer 157 in this embodiment of this application for the sake of readability, hereinafter the same), a TFT array layer 158, a substrate 159, a back film 160, a vibration damping layer 161, and a support layer 162. The layers are successively stacked with the polarizer 151 facing toward the cover plate 14 and the support layer 162 facing away from the cover plate 14. The through hole 15c runs through the layers. In the sectional view shown in FIG. 6, portions located on two sides of the through hole 15c may be symmetrical.

Figure 7:
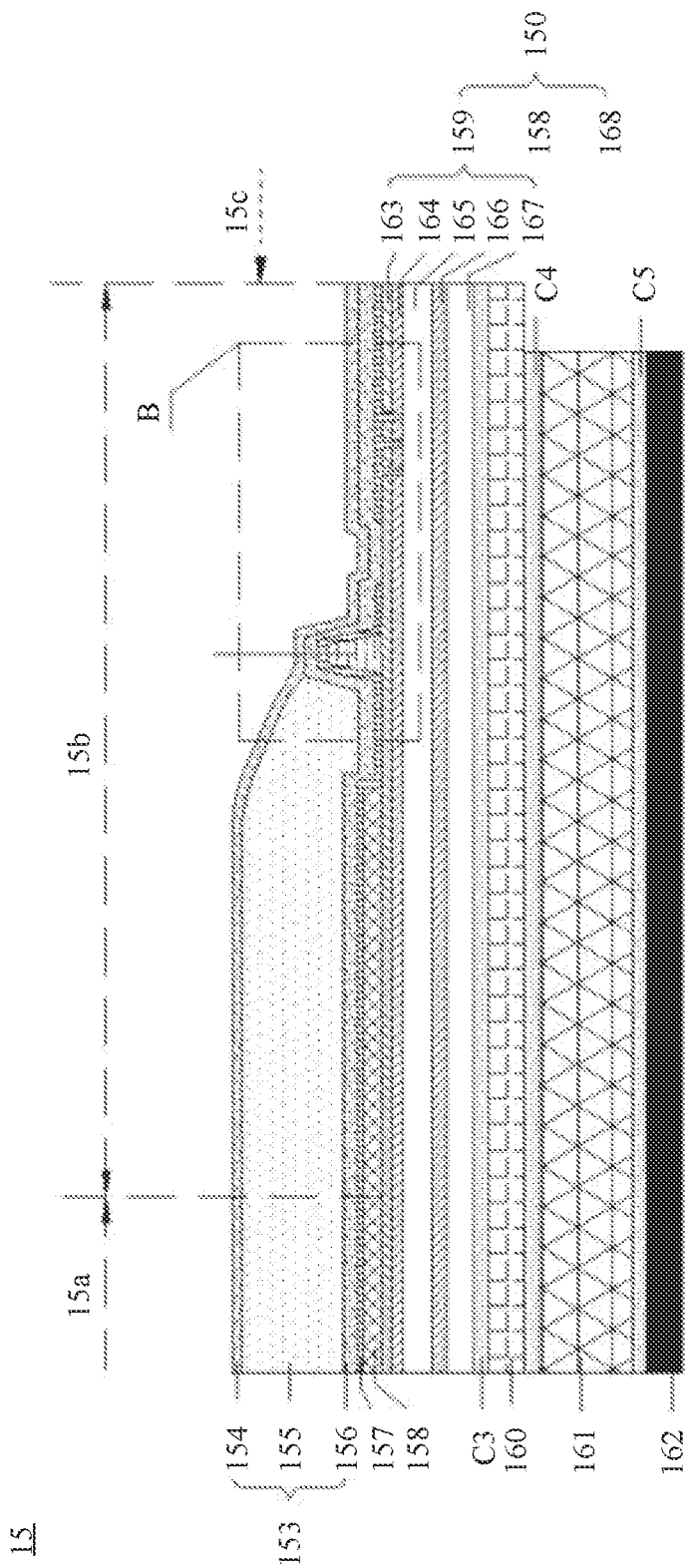
FIG. 7 is a partially enlarged schematic view of the display screen in FIG. 6.

The substrate 159 is a base material for forming a packaging layer 153 and an organic functional layer 157. The substrate 159 may have flexibility, and is easy to bend. The substrate 159 may be formed by stacking a plurality of layers of materials. As shown in FIG. 6 and FIG. 7 (FIG. 7 illustrates an intercepted part of the display panel 15 and on the left side of the through hole 15c in FIG. 6), the substrate 159 may include a first organic polymer material layer 167, a first isolation layer 166, a second organic polymer material layer 165, a second isolation layer 164, and a buffer layer 163 that are successively stacked. The first organic polymer material layer 167 faces away from the cover plate 14, and the buffer layer 163 faces toward the cover plate 14.

The first organic polymer material layer 167 and the second organic polymer material layer 165 may be made of, for example, an organic polymer material such as polyimide (PI). The first organic polymer material layer 167 and the second organic polymer material layer 165 have a high flexibility and are flexible base materials in the substrate 159. The first isolation layer 166 and the second isolation layer 164 may be made of at least one of an inorganic material such as SiNx (silicon nitride), SiO2 (silicon dioxide), Si (silicon), SiNxO (silicon oxynitride), and Al2O3 (alumina). The first isolation layer 166 and the second isolation layer 164 have a water and oxygen isolation performance, and can prevent water and oxygen from invading the first organic polymer material layer 167, the second organic polymer material layer 165, and the organic functional layer 157. The buffer layer 163 may be made of an inorganic material such as SiNx and/or SiO2. The buffer layer 163 can prevent impurity ions in the first organic polymer material layer 167 and the second organic polymer material layer 165 from entering the TFT array layer 158 and avoid affecting the performance of the TFT array layer 158. The buffer layer 163 may further have a water and oxygen isolation performance, and can prevent water and oxygen from invading the organic functional layer 157, the first organic polymer material layer 167, and the second organic polymer material layer 165.

The structure stacked by a plurality of layers of materials of the substrate 159 has both a good flexibility and a good isolating and cushioning performance. In other embodiments, the stacked structure and material selection of the substrate 159 may be designed according to requirements and are not limited to the foregoing description. For example, the first isolation layer 166 and the second isolation layer 164 may be replaced by a stainless steel sheet, ultra thin glass (UTG), polyethylene terephthalate (PET), fiber, or the like, so that the substrate 159 having greater rigidity is manufactured.

As shown in FIG. 7, the TFT array layer 158 is formed on the substrate 159, and for example, may be formed on the buffer layer 163 in the substrate 159. The TFT array layer 158 may be distributed in the display area 15a and the non-display area 15b, where the part distributed in the non-display area 15b may be located on an outer circumference of the through hole 15c (which is continuously described below). The TFT array layer 158 may include a TFT array made of a plurality of TFTs crisscrossed and is configured to control and drive the organic functional layer 157. The TFT array layer 158 may further include an anode (an anode of an OLED device). The TFT array layer 158 is electrically connected to the flexible circuit board 161. The improvement of this embodiment of this application does not lie in the TFT array layer 158 and therefore the specific structure of the TFT array layer 158 is not limited.

Figure 8:
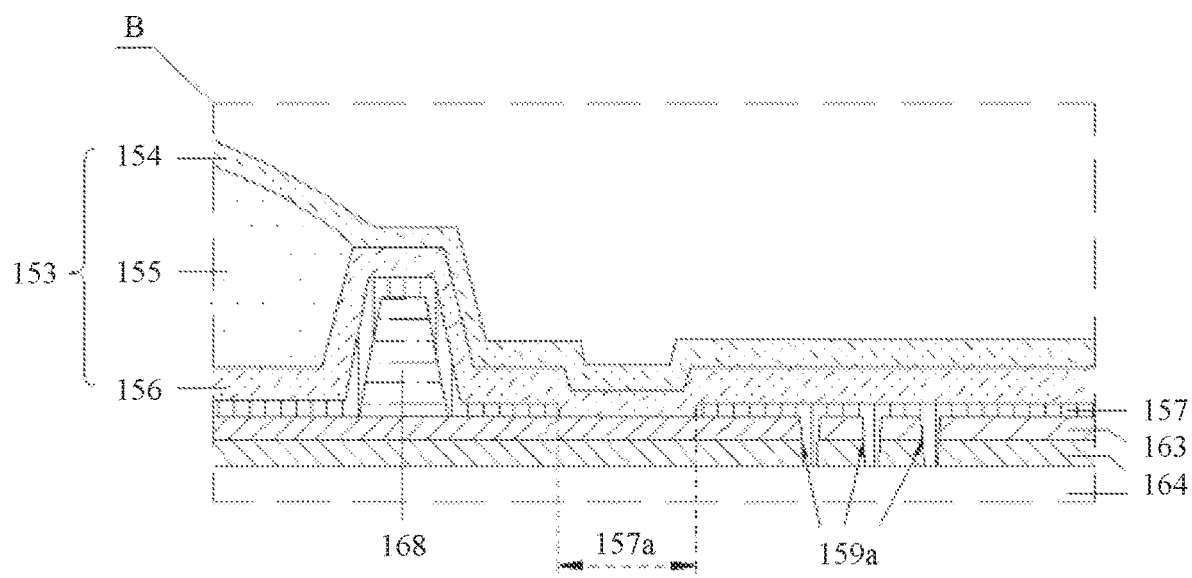
FIG. 8 is a partially enlarged schematic view of a portion B in FIG. 7.

As shown in FIG. 7 and FIG. 8, a barrier dam 168 may also be formed on the substrate 159, for example, the barrier dam 168 may be formed on the buffer layer 163 in the substrate 159. The barrier dam 168 and the TFT array layer 158 may be on the buffer layer 163 and may be spaced apart. The barrier dam 168 is in the non-display area 15b and may be located between the TFT array layer 158 and the through hole 15c. A cross-sectional shape of the barrier dam 168 may be, for example, trapezoidal. The height of the barrier dam 168 may be a few microns, such as 1 μm-4 μm (including endpoint values). The barrier dam 168 is configured to block the organic packaging layer 155 described below.

In Embodiment 1, the substrate 159 and the TFT array layer 158 and the barrier dam 168 on the substrate 159 may serve as the basic structure of the TFT backplane 150, that is, the TFT backplane 150 includes the substrate 159 and the TFT array layer 158 and the barrier dam 168 on the substrate 159.

Figure 9:
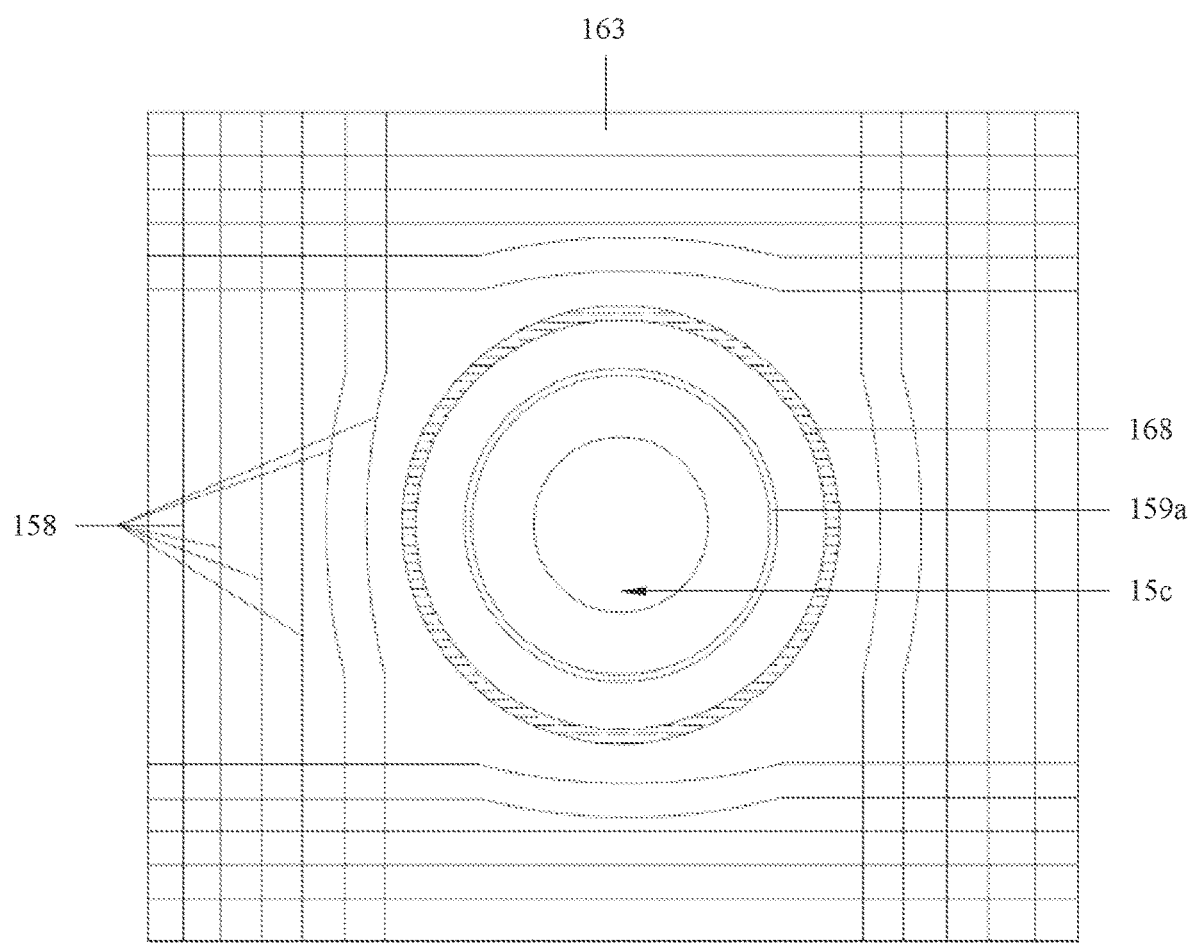
FIG. 9 is a schematic diagram illustrating a position relationship between a buffer layer, a thin film transistor array layer, a barrier dam, a crack arrest groove, and a through hole of the display panel of the display screen in FIG. 6.

FIG. 9 illustrates a position relationship of the TFT array layer 158, the barrier dam 168, and the through hole 15c on the buffer layer 163 from a perspective of a top view (that is, the perspective along the thickness direction of the display panel 15), where only partial areas of the TFT array layer 158 and the buffer layer 163 are intercepted. For ease of distinction, the barrier dam 168 is represented by hatched lines. The TFT array layer 158 is represented by crisscrossed lines. As shown in FIG. 9, the barrier dam 168 may be enclosed in a closed ringlike shape, for example, a circular shape. The barrier dam 168 surrounds the outer circumference of the through hole 15c. The barrier dam 168 is configured to block an organic material in the packaging layer 153, which is described below.

The barrier dam 168 may be made of a single material or may be made of at least two layers of materials stacked. The material of the barrier dam 168 includes, but is not limited to, an organic material or an inorganic material. FIG. 8 illustrates only one barrier dam 168, which is merely an example. More barrier dams 168, for example, two barrier dams, may be disposed according to product requirements. Alternatively, the barrier dam 168 may not be disposed according to product requirements.

As shown in FIG. 8, the substrate 159 may also be provided with a crack arrest groove 159a. For example, the crack arrest groove 159a may run through the buffer layer 163 and the second isolation layer 164 in the substrate 159. In other embodiments, the crack arrest groove 159a may also run through only the buffer layer 163 in the substrate 159.

As shown in FIG. 8 and FIG. 9, the crack arrest groove 159a is located between the barrier dam 168 and the through hole 15c. The crack arrest groove 159a may be enclosed to form a closed ringlike shape, for example, a circular shape. The crack arrest groove 159a surrounds the outer circumference of the through hole 15c. The quantity of the crack arrest grooves 159a may be determined according to requirements, which is not limited to the quantity of three shown in FIG. 8, and may also be, for example, one, two, or more than three. In addition, because the width of the crack arrest grooves 159a is small, the three crack arrest grooves 159a are represented by one circular area in FIG. 9 for the sake of clarity of the drawing.

In a case that the through hole 15c is provided in the display panel 15, when the optical module 13 is assembled with the display screen 11 or when the cover plate 14 is laminated to the display panel 15, stress concentration occurs in the vicinity of the through hole 15c, which may cause a crack in the display panel 15 and the crack may extend in a direction from the through hole 15c to the display area 15a. After the crack arrest groove 159a is provided, the stress in the display panel 15 is released when the crack extends to the crack arrest groove 159a, and the crack stops in the crack arrest groove 159a. Therefore, the crack arrest groove 159a has a function of blocking crack extension. Because the crack arrest groove 159a surrounds by one round, cracks from all directions can be blocked. The design of the crack arrest groove 159a can prevent damage to the display area 15a and to ensure reliability of the display area 15a.

In other embodiments, other structures having stress relief and crack arrest effects may be designed and are not limited to the crack arrest groove 159a described above. Alternatively, the crack arrest groove 159a may not be provided according to product requirements.

As shown in FIG. 6 to FIG. 8, the organic functional layer 157 covers the substrate 159 (for example, covering the buffer layer 163), the TFT array layer 158, and the barrier dam 168. The organic functional layer 157 may be distributed in the display area 15a and the non-display area 15b. The part located in the display area 15a may be referred to as a first organic layer and the part located in the non-display area 15b may be referred to as a second organic layer. The part of the organic functional layer 157 located in the display area 15a includes a plurality of display units. The display unit is a pixel. Each pixel may include a red sub-pixel R, a green sub-pixel G, and a blue sub-pixel B, and each pixel can emit a light ray to implement image display. The part of the organic functional layer 157 located in the non-display area 15b has no pixels and cannot emit light. As shown in FIG. 7 and FIG. 8, the part of the organic functional layer 157 located in the non-display area 15b may be filled in the crack arrest groove 159a. In other embodiments, the organic functional layer 157 may not need to be filled in the crack arrest groove 159a.

Preferably, the organic functional layer 157 in Embodiment 1 may include a basic layer and a light-emitting layer. The basic layer is distributed in both the display area 15a and the non-display area 15b and the light-emitting layer is distributed only in the display area 15a.

Figure 10:
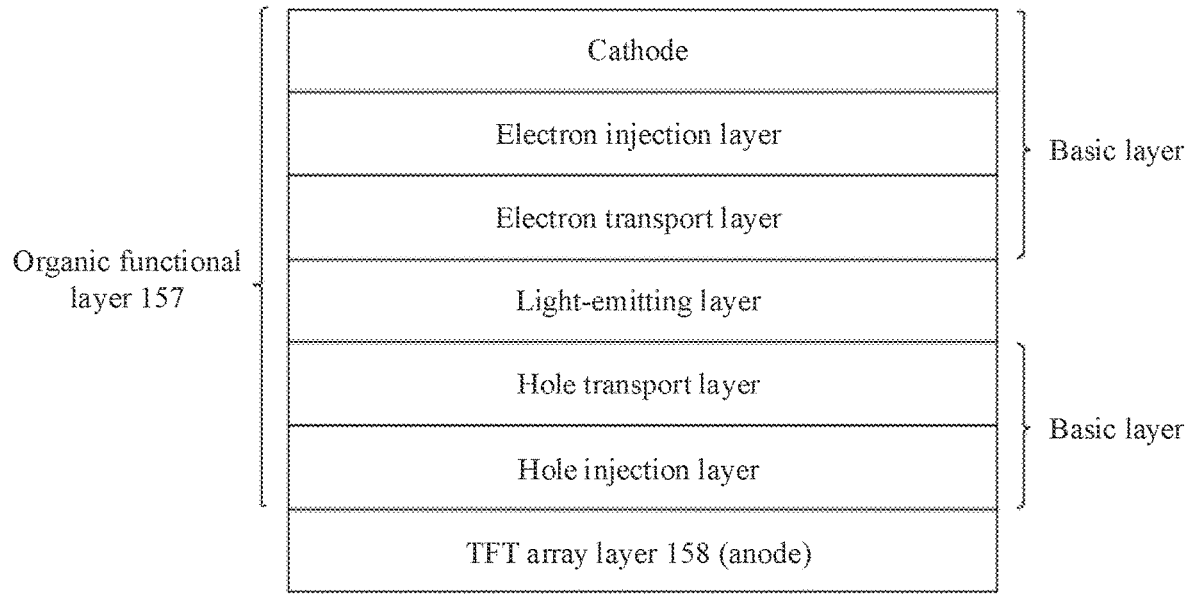
FIG. 10 is a schematic diagram illustrating a layered structure of an organic functional layer in FIG. 8.

FIG. 10 is a schematic diagram of a layered structure of a part of the organic functional layer 157 located in the display area 15a. As shown in FIG. 10, the part of the organic functional layer 157 located in the display area 15a may include a cathode, an electron injection layer, an electron transport layer, a light-emitting layer, a hole transport layer, and a hole injection layer that are successively stacked, and the layers except the light-emitting layer all pertain to the basic layer. The hole injection layer may be oriented toward the TFT array layer 158 and the cathode layer may face away from the TFT array layer 158 (the TFT array layer 158 may include an anode of an OLED device to be mentioned below). Functions and material selection of the basic layer of the organic functional layer 157, such as the cathode, the electron injection layer, the electron transport layer, the hole transport layer, and the hole injection layer, are common general knowledge in the art, which are not described in detail herein. The organic functional layer 157 may be prepared using an evaporation process.

In an implementation, the light-emitting layer may be made of an OLED light-emitting material, such as an organic small molecule light-emitting material, a complex light-emitting material, or a high molecular polymer. The light-emitting layer includes a plurality of red light portions R (capable of emitting red light), a plurality of green light portions G (capable of emitting green light), and a plurality of blue light portions B (capable of emitting blue light), and these light-emitting portions of different colors are arranged in an array. Each red light portion R may be referred to as a red sub-pixel R, each green light portion G may be referred to as a green sub-pixel G, and each blue light portion B may be referred to as a blue sub-pixel B. One red sub-pixel R, one green sub-pixel G, and one blue sub-pixel B may form one pixel, that is, the display unit described above. The part of the organic functional layer 157 in the display area 15a includes an OLED light-emitting layer and may be referred to as an OLED device. That is, the display panel 15 in this implementation may be an OLED display panel. The other part of the organic functional layer 157 in the non-display area 15b has only a basic layer and does not include a light-emitting layer, so that it does not display an image.

In another implementation, unlike the foregoing implementations, the light-emitting layer may be made of a quantum dot (QD) light-emitting material, that is the light-emitting layer is a QD light-emitting layer. A QD light-emitting material in QD light-emitting layer is grains with diameters between 2 nm-10 nm. The grains with different diameters may emit red, green, and blue monochromatic light respectively under excitation of electric field, so as to form a red sub-pixel R, a green sub-pixel G, and a blue sub-pixel B, respectively. Correspondingly, the display panel 15 of this implementation may be referred to as an electroluminescent QLED display panel.

Figure 11:
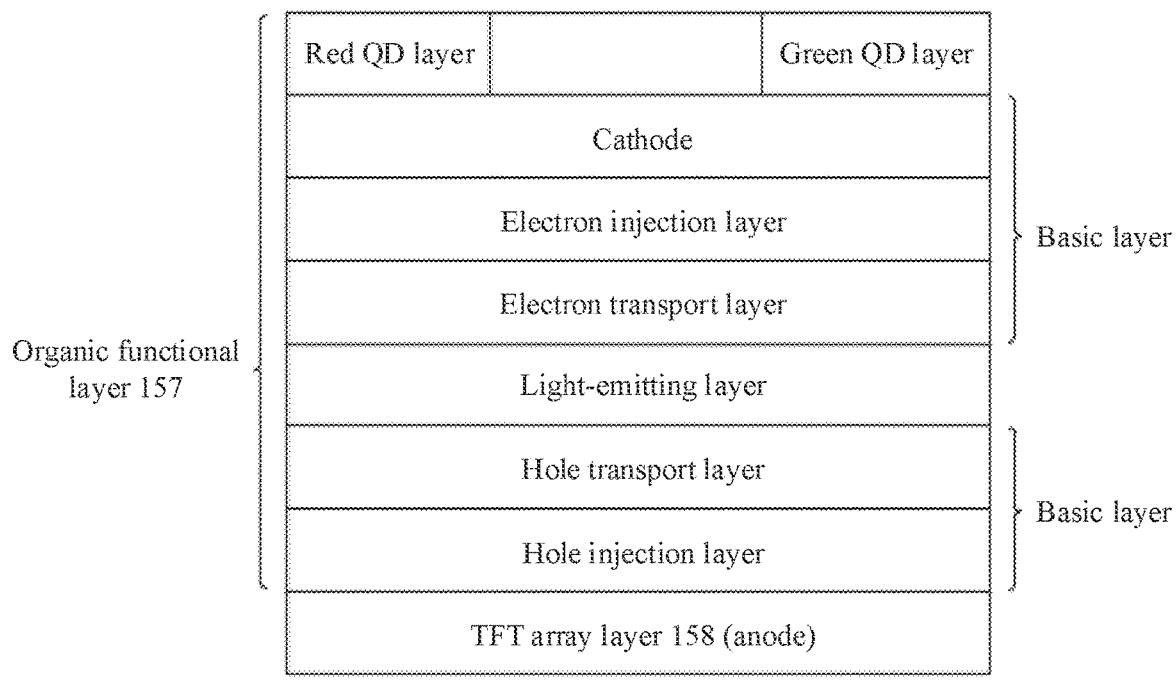
FIG. 11 is a schematic diagram illustrating a layered structure of an organic functional layer according to another embodiment.

FIG. 11 is a schematic diagram of a layered structure of a part of the organic functional layer 157 located in the display area 15a according to another embodiment. As shown in FIG. 11, the organic functional layer 157 in this embodiment may include a basic layer, a light-emitting layer a red QD layer, and a green QD layer. The basic layer is the same as stated above, description of which is not repeated. The difference is that the light-emitting layer may be made of a blue OLED material, and the light-emitting layer can only emit blue light, that is, the light-emitting layer may be used as a blue sub-pixel B. The red QD layer and the green QD layer cover the cathode, and the red QD layer and the green QD layer are distributed in spaced arrays. Both the red QD layer and the green QD layer are formed by a QD light-emitting material. The red QD layer can convert blue light of the light-emitting layer into red light, and the red QD layer forms a red sub-pixel R. The green QD layer can convert blue light of the light-emitting layer into green light, and the green QD layer forms a green sub-pixel G. The spacing between the red QD layer and the green QD layer allows blue light of the light-emitting layer to pass through, so that the light emitted from the red sub-pixel R, the green sub-pixel G, and the blue sub-pixel B may be mixed to form a pixel, that is, the display unit described above. The display panel 15 of this embodiment may be referred to as a photoluminescence QLED display panel. The other part of the organic functional layer 157 in the non-display area 15b may have only a basic layer and do not include a light-emitting layer, a red QD layer, or a green QD layer, so that it does not display an image.

As shown in FIG. 7 and FIG. 8, the part of the organic functional layer 157 located in the non-display area 15b may be provided with a packaging groove 157a. The packaging groove 157a runs through the organic functional layer 157 and is located between the barrier dam 168 and the crack arrest groove 159a. Certainly, the packaging groove 157a is also located between the barrier dam 168 and the through hole 15c. The cross-sectional shape of the packaging groove 157a (referring to the cross-sectional shape of the packaging groove 157a obtained by cutting the display panel 15 along a section A-A in FIG. 2) may be approximately a "large above and small below" trapezoidal shape, that is, a width of the packaging groove 157a on a side away from the buffer layer 163 is greater than the width of the packaging groove 157a on a side close to the buffer layer 163. Alternatively, the cross section of the packaging groove 157a may be another appropriate shape, for example, an approximate rectangle.

The width of the packaging groove 157a may be, for example, 10 μm-50 μm, such as 10 μm, 20 μm, 35 μm, or 50 μm.

The width of the packaging groove 157a on the side away from the buffer layer 163 may be within the width range, and the width of the packaging groove 157a on the side close to the buffer layer 163 may also be within the width range. Because the magnitude of width dimension is extremely small (at the μm level) and width data obtained by selecting any appropriate measurement datum is substantially consistent, the selection of measurement datum can be ignored. For example, a midline length of the trapezoidal cross section of the packaging groove 157a may be used as the width dimension. The depth of the packaging groove 157a may be, for example, 100 nm-500 nm, such as 100 nm, 250 nm, or 500 nm. There may be at least one packaging groove 157a. FIG. 8 illustrates only one packaging groove 157a, which is merely an example and is not a limitation to this embodiment of this application. When there are two or more packaging grooves 157a, the packaging grooves 157a may be distributed on both inner and outer sides of the barrier dam 168, that is, the packaging groove 157a is provided between the packaging groove 157a and the through hole 15c and on outer circumference of the packaging groove 157a.

Figure 12:
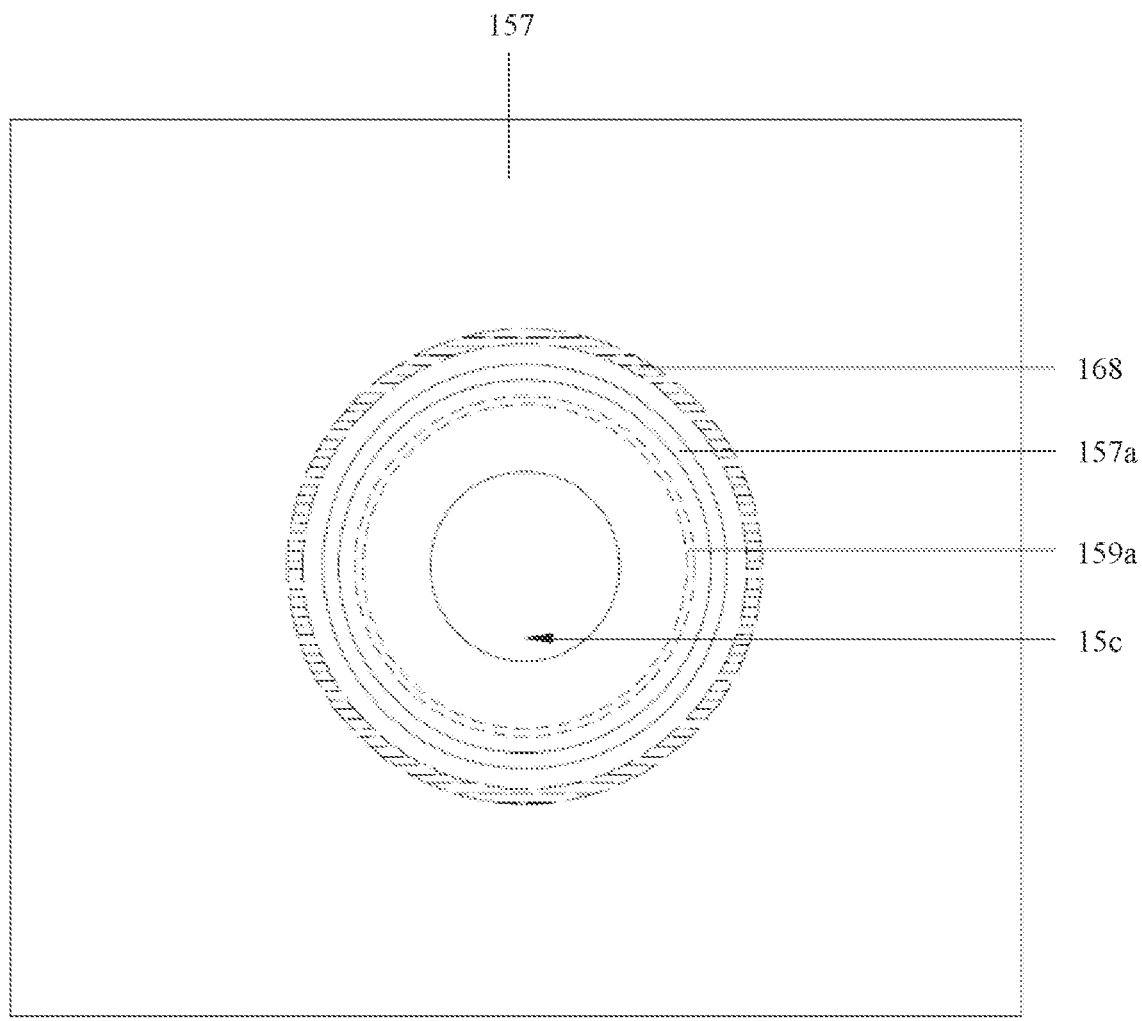
FIG. 12 is a schematic diagram illustrating a position relationship between an organic functional layer, a barrier dam, a packaging groove, a crack arrest groove, and a through hole in FIG. 8.

FIG. 12 shows the relative position relationship of the barrier dam 168, the packaging groove 157a, the crack arrest groove 159a, the through hole 15c, and the organic functional layer 157 from a perspective of a top view (that is, from the perspective in the thickness direction of the display panel 15). For ease of distinction, the barrier dam 168 is represented by hatched lines and contours of the barrier dam 168 and the crack arrest groove 159a covered by the organic functional layer 157a are defined by dashed lines, respectively. As shown in FIG. 12, the packaging groove 157a may be enclosed in a closed ringlike shape, for example, a circular shape. The packaging groove 157a surrounds an outer circumference of the crack arrest groove 159a and the through hole 15c. The packaging groove 157a is provided for the packaging layer 153 to be filled in, so as to prevent water and oxygen entering from the through hole 15c from invading the display area 15a. This is described in detail below.

In Embodiment 1, the packaging groove 157a may be manufactured by laser etching the organic functional layer 157. A basic principle of laser etching is to focus a low-power laser beam with high beam quality (for example, may be ultraviolet laser, fiber laser, or the like) into an extremely small light spot, and form an extremely high power density at the focus, so that a material of the organic functional layer 157 vaporizes and evaporates instantly, to form the packaging groove 157a. Laser etching has a small heat affected zone, can ablate the machining area quite accurately, has an extremely high machining accuracy and machining quality, and therefore can etch the packaging groove 157a having an extremely small width. Moreover, because the laser etching can focus into an extremely small light spot at a laser wavelength level, the organic functional layer 157 can be completely etched away, and even the buffer layer 163 below the organic functional layer 157 may be etched, which is beneficial to the filling of the packaging layer 153 (which is continuously described below). In addition, the laser etching is suitable for processing a flexible material without contact with and contamination of the organic functional layer 157.

As shown in FIG. 7 and FIG. 8, the packaging layer 153 covers the organic functional layer 157 and may be distributed in the display area 15a and the non-display area 15b. The packaging layer 153 may include a first inorganic packaging layer 156, an organic packaging layer 155, and a second inorganic packaging layer 154.

The first inorganic packaging layer 156 covers the entire area of the organic functional layer 157 and is filled in the packaging groove 157a to partition the organic functional layer 157. The part of the first inorganic packaging layer 156 filled in the packaging groove 157a may be in contact with the buffer layer 163. The thickness of the first inorganic packaging layer 156 may be 0.5 µm-1.2 µm, such as 0.5 µm, 1 µm, or 1.2 µm. It can be seen that the thickness of the first inorganic packaging layer 156 is greater than the depth (100 nm-500 nm) of the packaging groove 157a and the packaging groove 157a can be filled up with the first inorganic packaging layer 156. The first inorganic packaging layer 156 may be made of an inorganic material, such as SiNx and/or SiO2. Due to the properties of the inorganic material, the first inorganic packaging layer 156 has a good water and oxygen permeability resistance performance, and can block water and oxygen (for example, the water and oxygen entering from the through hole 15c) at the packaging groove 157a, so that the water and oxygen cannot cross the packaging groove 157a to invade the display area 15a along the organic functional layer 157. The first inorganic packaging layer 156 may be prepared using a low temperature chemical vapor deposition (CVD) process or an atomic layer deposition (ALD) process. The trapezoidal cross-sectional shape of the packaging groove 157a facilitates sufficient deposition of the inorganic material inside the packaging groove 157a. In other embodiments, the thickness, material, and molding process of the first inorganic packaging layer 156 may be determined according to requirements and are not limited to the foregoing description.

The organic packaging layer 155 covers the first inorganic packaging layer 156 and is distributed within a barrier dam 168, which serves as a boundary of the first inorganic packaging layer 156. The thickness of the organic packaging layer 155 may be 5 µm-15 µm, such as 5 µm, 12 µm, or 15 µm. The organic packaging layer 155 may be made of an organic material such as an epoxy resin type organic material and polymethyl methacrylate. The organic material may be printed onto the first inorganic packaging layer 156 through an ink jet printing process, and the organic material is cured to form the organic packaging layer 155. The organic material has fluidity before curing, and the barrier dam 168 can block it. With the fluidity of the organic material, the organic packaging layer 155 can be made to form a level surface, which facilitates subsequent formation of the second inorganic packaging layer 154. Moreover, the organic packaging layer 155 has a good flexibility, and the first inorganic packaging layer 156 and the second inorganic packaging layer 154 have a poor flexibility. The organic packaging layer 155 isolates the first inorganic packaging layer 156 from the second inorganic packaging layer 154. Such the "sandwich" structure can ensure that the packaging layer 153 has a good flexibility as a whole to meet bending requirements. In other embodiments, the thickness, material, and molding process of the organic packaging layer 155 may be determined according to requirements and are not limited to the foregoing description. For example, the organic packaging layer 155 may be prepared by a one drop fill (ODF) process.

The second inorganic packaging layer 154 covers the first inorganic packaging layer 156 and the organic packaging layer 155. The thickness of the second inorganic packaging layer 154 may be 0.3 µm-1.2 µm, such as 0.3 µm, 0.7 µm, or 1.2 µm. The second inorganic packaging layer 154 may be made of an inorganic material, such as SiNx and/or SiO2. The second inorganic packaging layer 154 similarly has a good water and oxygen permeability resistance performance, and can block water and oxygen (for example, the water and oxygen entering from the through hole 15c, or the water and oxygen entering from a side of the second inorganic packaging layer 154 facing away from the first inorganic packaging layer 156), so as to prevent the water and oxygen from invading the organic packaging layer 155 and the display area 15a. Therefore, by using the second inorganic packaging layer 154, the water and oxygen barrier performance can be further improved. The second inorganic packaging layer 154 may be prepared using a low temperature CVD process or an ALD process. In other embodiments, the thickness, material, and molding process of the second inorganic packaging layer 154 may be determined according to requirements and are not limited to the foregoing description.

The packaging layer 153 in Embodiment 1 is a "sandwich" configuration including the first inorganic packaging layer 156, the organic packaging layer 155, and the second inorganic packaging layer 154, which is merely an example. In other embodiments, the packaging layer 153 may be alternately stacked by a plurality of layers of inorganic material-organic material, and for example, the packaging layer 153 may include seven or five layers of materials. Alternatively, according to requirements, other processes may be employed to prepare the packaging layer 153, which may have only one or two layers of materials, and the barrier dam 168 may not be disposed.

In Embodiment 1, the packaging groove 157a is provided in the part of the organic functional layer 157 and located in the non-display area, and the packaging layer 153 is filled in the packaging groove 157a, to partition the organic functional layer 157, so that external water and oxygen entering from the through hole 15c can be blocked at the packaging groove 157a, and the external water and oxygen can be prevented from invading the display area 15a along the organic functional layer 157. Because the structure of the packaging groove 157a is simple and easy to process, the manufacturing cost is low.

Moreover, an appropriate processing process (for example, laser etching) may be adopted to ensure that the width of the packaging groove 157a is small, so that the non-display area 15b can have a small width (referring to FIG. 6 and FIG. 7), and therefore the opaque area 14b in the cover plate 14 can also be made narrow, thereby being beneficial to increase of the screen ratio of the electronic device 10.

Figure 13:
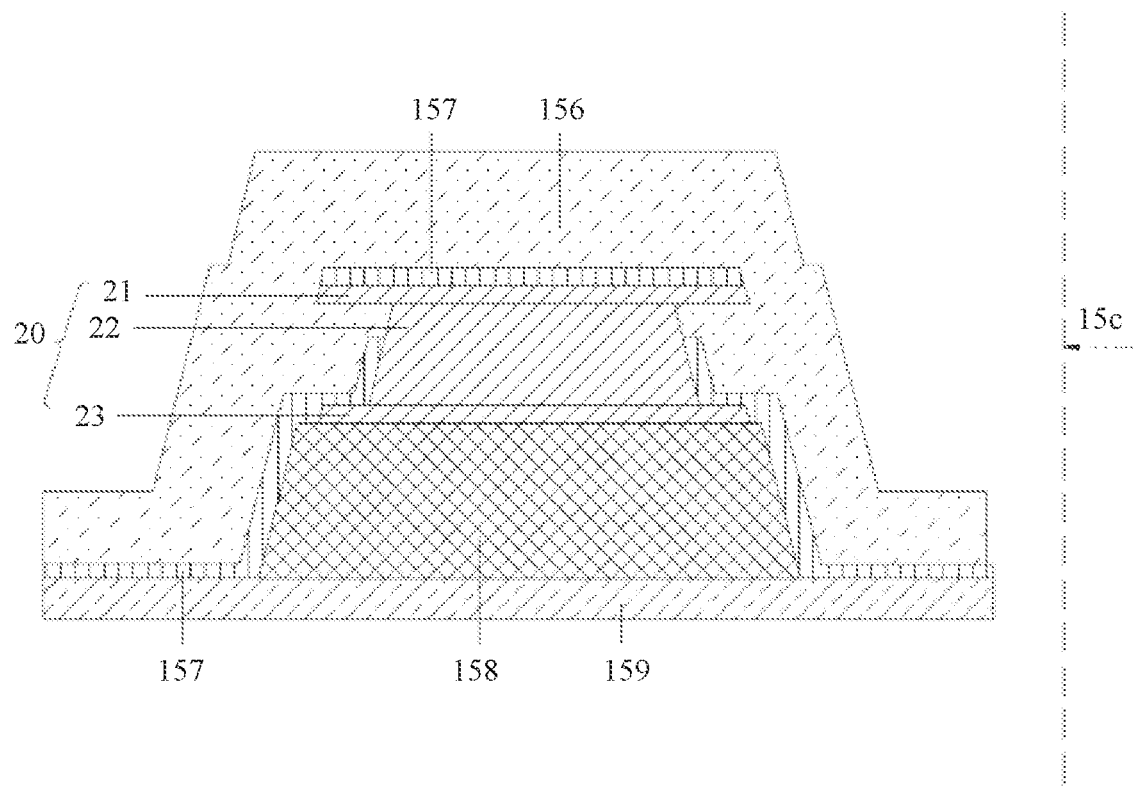
FIG. 13 is a schematic sectional view illustrating that an isolation column partitions an organic functional layer of a conventional display panel.

FIG. 13 is a schematic illustration of a conventional flexible display panel partitioning the organic functional layer 157 by using an isolation column 20. What is intercepted is a layered structure of the non-display area and located on the outer circumference of the through hole 15c. As shown in FIG. 13, the isolation column 20 may be formed on the TFT array layer 158. The isolation column 20 may include a lower isolation layer 23, a middle isolation layer 22, and an upper isolation layer 21 that are successively stacked. The width of the lower isolation layer 23 and the width of the upper isolation layer 21 (the dimensions in the left-right direction in FIG. 13) are greater than the width of the middle isolation layer 22. Such the structure may be referred to as an undercut structure (undercut). When the organic functional layer 157 is formed through an evaporation process, an evaporated material is deposited on a surface of the isolation column 20. Because deposition of evaporated materials is oriented (particles move substantially in a straight line) and there is the undercut structure, the finally manufactured organic functional layer 157 may cover the upper isolation layer 21, the TFT array layer 158, and the substrate 159, and may also cover part of the lower isolation layer 23 and part of the middle isolation layer 22. However, the part of the organic functional layer 157 covering the upper isolation layer 21 is cut off from the rest of the organic functional layer 157 at the isolation column 20. The first inorganic packaging layer 156 covers the organic functional layer 157 and is filled in a space at the isolation column 20 to partition the organic functional layer 157. When the external water and oxygen invades the organic functional layer 157 from the side of the through hole 15c, since the organic functional layer 157 is cut off at the isolation column 20, the external water and oxygen cannot continuously cross the isolation column 20 for invading, thereby playing a role of blocking the water and oxygen.

As can be seen from FIG. 13 and the foregoing description, the structure of the isolation column 20 is relatively complex, which leads to a complicated manufacturing process of the isolation column 20 and a high manufacturing cost of the conventional flexible display panel.

Moreover, due to the limitation of process accuracy, the organic functional layer 157 cannot be completely cut off by a single isolation column 20, resulting in poor water and oxygen packaging effect. In order to make up for this defect, it is usually necessary to provide a plurality of isolation columns 20 (for example, 11), and the total width of the plurality of isolation columns 20 can reach 150 μm, which in turn leads to an increase in the width of the non-display area, resulting in decrease in the screen ratio. To sum up, the solution of Embodiment 1 can implement packaging of the area close to the through hole 15c of the display panel 15 with a simple structure, and can reduce the packaging width and increase the screen ratio of the electronic device.

As shown in FIG. 6 and FIG. 7, the touch layer 152 may be located on the side of the packaging layer 153 away from the organic functional layer 158, for example, the touch layer 152 may be laminated to the packaging layer 153 through an adhesive layer C2. In other embodiments, the touch layer 152 may be integrated with the packaging layer 153, that is, the touch layer 152 is formed together in the manufacturing process of the display panel 15, instead of laminating an independent touch layer 152 to the packaging layer 153. The touch layer 152 may include touch units arranged in an array and configured to implement a touch operation of the display panel 15.

As shown in FIG. 6 and FIG. 7, the polarizer 151 may be located in the side of the touch layer 152 facing away from the packaging layer 153. The polarizer 151 may be laminated to the cover plate 14 through the adhesive layer C1. A through hole aligned with the through hole 15c may be formed in the adhesive layer C1, so that an external light ray can conveniently enter the through hole 15c. Alternatively, the adhesive layer C1 may be an adhesive having a good light transmittance. In this case, an external light ray may still enter the through hole 15c without providing a through hole in the adhesive layer C1.

As shown in FIG. 6 and FIG. 7, the back film 160 may be laminated to a side of the substrate 159 facing away from the organic functional layer 158. For example, the back film 160 may be laminated to the first organic polymer material layer 167 through an adhesive layer C3. The back film 160 is a protective layer on a back side of the display panel 15. The back film 147 may be made of, for example, a polyimide material or a PET material, or may also be made of other appropriate materials.

As shown in FIG. 6 and FIG. 7, the vibration damping layer 161 is located in a side of the back film 160 facing away from the substrate 159, and the vibration damping layer 161 can be laminated to the back film 160 through an adhesive layer C4. The vibration damping layer 161 may be made of, for example, a foam material or another material capable of damping and absorbing vibration. The vibration damping layer 161 has a buffering and vibration absorbing effect and can improve the impact resistance performance of the display panel 15.

As shown in FIG. 6 and FIG. 7, the support layer 162 is located in the side of the vibration damping layer 161 facing away from the back film 160, and the support layer 162 can be laminated to the vibration damping layer 161 through an adhesive layer C5. The support layer 162 may be, for example, a metal layer such as a copper foil or a steel sheet (such as SUS stainless steel). The support layer 162 may have performance of mechanical protection, heat dissipation, electromagnetic interference resistance, or the like.

In addition, in consideration of the heat dissipation of the display panel 15, a graphite material may be mixed in the vibration damping layer 161, a graphite sheet is laminated to the support layer 162, or a graphite sheet is directly used instead of the support layer 162. Certainly, the design of using graphite for heat dissipation is not necessary.

The foregoing embodiments explain in detail the structure of the display panel 11 in this embodiment of this application and the following describes the method for manufacturing the display panel 11. The following components with the same name as above have the same structure as above and will not be repeated hereinafter. Embodiment 2 provides a method for manufacturing a display panel, which is used for manufacturing the display panel 11. The manufacturing method may include the following steps.

S31: Manufacture a TFT backplane.

S32: Form an organic functional layer on the TFT backplane, where the organic functional layer includes a first organic layer and a second organic layer, the first organic layer is disposed around the second organic layer, the first organic layer includes a plurality of display units, the first organic layer serves as a display area of the display panel, the second organic layer does not include a display unit, and the second organic layer serves as a non-display area of the display panel.

S33: Provide a packaging groove around the second organic layer by one round, so that the packaging groove runs through the second organic layer.

S34: Form a packaging layer on the organic functional layer, so that the packaging layer covers the first organic layer and the second organic layer and is filled in the packaging groove.

S35: Form a touch layer and a polarizing layer on the packaging layer, so that the touch layer is located between the packaging layer and the polarizing layer, to prepare a prefabricated panel.

S36: Provide a through hole on the prefabricated panel, so that the through hole is located on an inner circumference of the packaging groove.

The TFT backplane prepared in S31 is the TFT backplane 150, and the TFT backplane 150 may be a flexible TFT backplane or a rigid TFT backplane. The following describes the in detail by using an example in which the TFT backplane 150 is a flexible TFT backplane with reference to FIG. 14 (FIG. 14 adopts a partial cross-sectional representation of FIG. 6) and FIG. 15.

Figure 14:
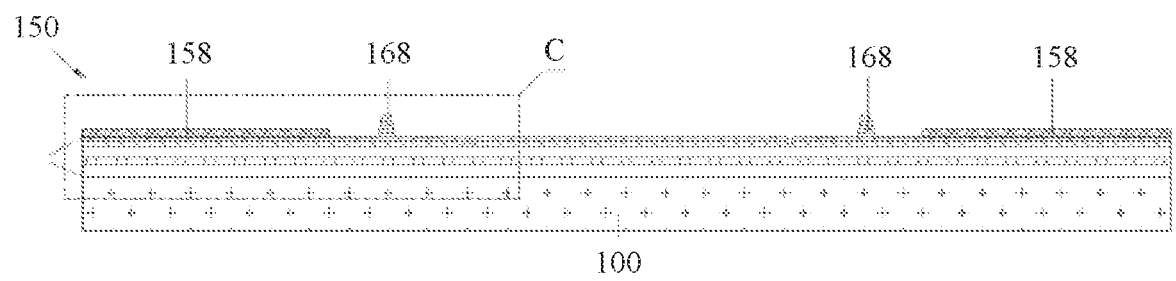
FIG. 14 is a schematic diagram of forming a thin film transistor backplane on a rigid carrier plate according to Embodiment 2.
Figure 15:
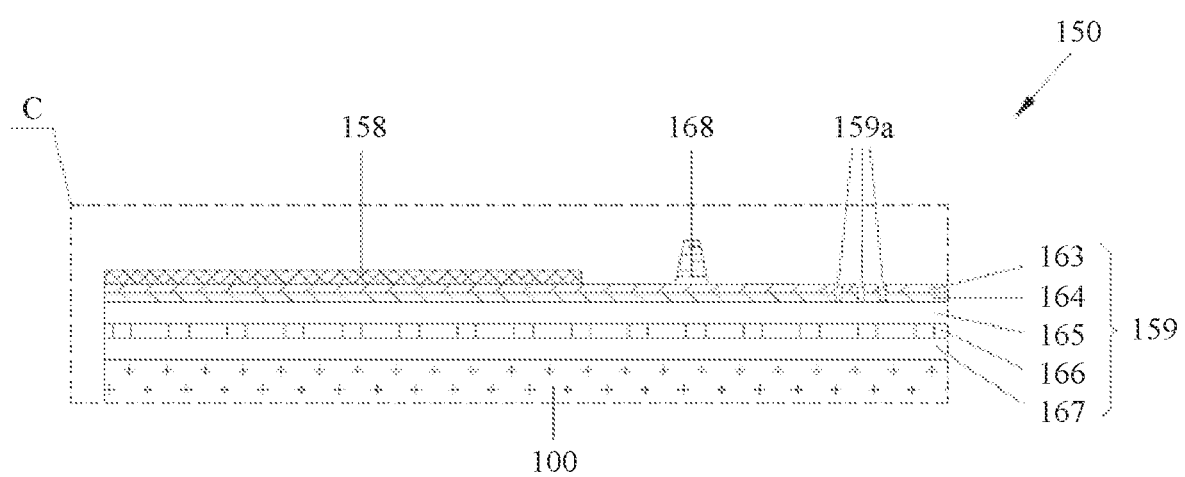
FIG. 15 is a partially-enlarged schematic structural diagram of a portion C in FIG. 14.

As shown in FIG. 14 and FIG. 15, in an implementation, step S31 may specifically include the following steps.

S311: Provide a rigid carrier plate 100. The rigid carrier plate 100 is a flat substrate and may be made of glass. The rigid carrier plate 100 has a relatively great rigidity, and can be used as a carrier to support a soft organic polymer material in the next step, so as to ensure that the size and flatness of the organic polymer material layer meet design requirements.

S312: Form at least two layers of organic polymer materials and at least two layers of inorganic materials on the rigid carrier plate 100, so that the at least two layers of organic polymer materials and the two layers of inorganic materials are alternately stacked, where one layer of the organic polymer material is directly laminated to the rigid carrier plate 100. For example, two layers of organic polymer material and two layers of inorganic material may be formed, the two layers of organic polymer material and the two layers of inorganic material are successively stacked in an order of organic polymer material-inorganic material-organic polymer material-inorganic material, and one layer of organic polymer material is tightly laminated to the rigid carrier plate 100. The organic polymer material includes, but is not limited to, PI and the like, and the organic polymer material forms an organic polymer material layer. The inorganic material includes, but is not limited to, at least one of SiNx, SiO2, Si, SiNxO, Al2O3, and forms an inorganic material layer. A first organic polymer material layer 167, a first isolation layer 166, a second organic polymer material layer 165, and a second isolation layer 164 are formed successively along a stacking direction of the materials.

S313: Cover an inorganic material such as SiNx and/or SiO2 on the formed second isolation layer 164, to form a buffer layer 163. According to product requirements, step S313 may not be present in other embodiments.

S314: Form a TFT array layer 158 on the buffer layer 163. For example, the TFT array layer 158 may be formed through an array process. The TFT array layer 158 is formed only in a partial area of the buffer layer 163. In other embodiments where no buffer layer 163 is formed, the TFT array layer 158 may be formed on the second isolation layer 164.

S315: Provide a crack arrest groove 159a in the TFT backplane 150 and surrounding the same by one round, so that the crack arrest groove 159a runs through only the buffer layer 163 and the second isolation layer 164, that is, the crack arrest groove 159a does not run through the flexible TFT backplane 150. For example, the buffer layer 163 and the second isolation layer 164 may be etched through an etching process, to form the crack arrest groove 159a. In other embodiments, the crack arrest groove 159a may also run through only the buffer layer 163. Alternatively, in embodiments where no buffer layer 163 is formed, the crack arrest groove 159a may run through only the second isolation layer 164.

In S315, at least one crack arrest groove 159a may be provided with, for example, the three crack arrest grooves 159a shown in FIG. 4, which are nested successively. According to product requirements, the crack arrest groove 159a may not be provided in other embodiments. In Embodiment 2, the sequence of step S315 and step S314 is not limited and may be determined according to product requirements.

S316: Form a barrier dam 168 around the buffer layer 163 by one round. There may be at least one barrier dam 168. FIG. 14 illustrates one barrier dam 168, and the quantity thereof may alternatively be two. The height of the barrier dam 168 may be 1 μm-4 μm (including endpoint values). The barrier dam 168 may be made of a single material or may be formed by stacking at least two layers of materials. The barrier dam 168 is configured to block an organic material in the packaging layer 153 formed in a subsequent step. In other embodiments, when the step of forming a buffer layer 163 is not included, step S316 may be forming a barrier dam 168 on the second isolation layer 164. Alternatively, in other embodiments, the step of forming a barrier dam 168 may not be included.

In Embodiment 2, the sequence of step S316, step S315, and step S314 is not limited and may be determined according to product requirements. The formed barrier dam 168 surrounds the outer circumference of the formed crack arrest groove 159a and the formed TFT array layer 158 is located on the outer circumference of the barrier dam 168.

Figure 16:
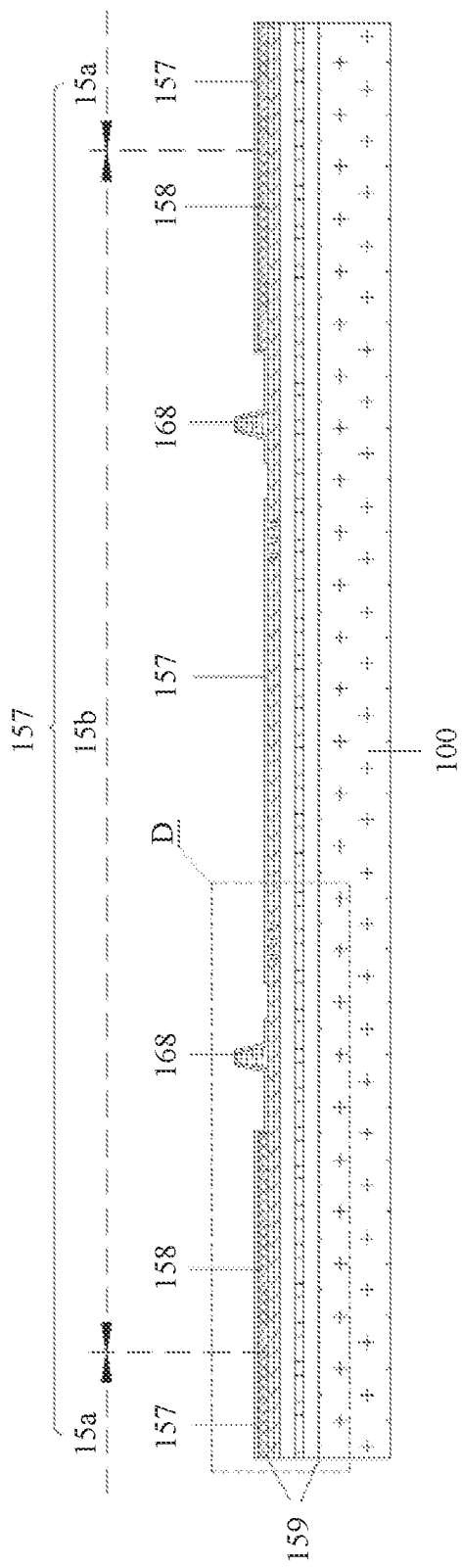
FIG. 16 is a schematic diagram of forming an organic functional layer on a thin film transistor backplane according to Embodiment 2.
Figure 17:
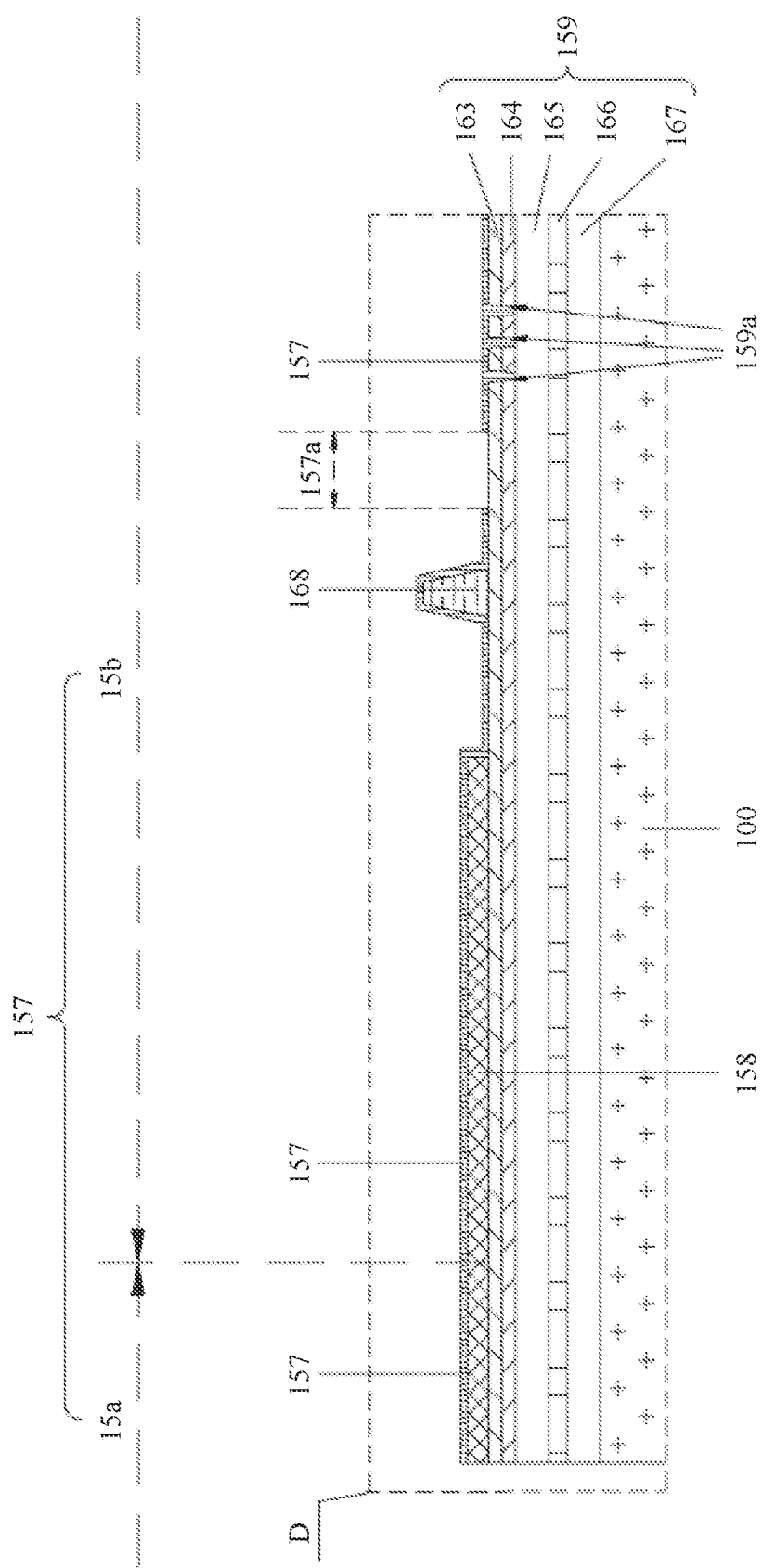
FIG. 17 is a partially-enlarged schematic structural diagram of a portion D in FIG. 16.

As shown in FIG. 16 and FIG. 17, the organic functional layer 157 formed in step S32 may cover the buffer layer 163, the TFT array layer 158, and the barrier dam 168. In step S32, for example, a plurality of layers of organic materials may be successively covered on the TFT backplane 150, to successively prepare a hole injection layer, a hole transport layer, a cathode, a light-emitting layer, an electron transport layer, and an electron injection layer, so as to manufacture the organic functional layer 157. The light-emitting layer may be distributed only on the outer circumference of the barrier dam 168, and the hole injection layer, the hole transport layer, the cathode, the electron transport layer, and the electron injection layer cover the entire TFT backplane 150 (including the barrier dam 168 and the crack arrest groove 159a). The light-emitting layer may be formed by using an OLED light-emitting material or a QD light-emitting material. Therefore, the area of the organic functional layer 157 having the light-emitting layer may be referred to as the first organic layer, which forms the display area 15a; and the area of the organic functional layer 157 not having a light-emitting layer may be referred to as a second organic layer, which forms the non-display area 15b.

In step S32 the organic functional layer 157 may be formed through an evaporation process, a printing process, or a coating process (coating).

As shown in FIG. 16 and FIG. 17, in step S33, the non-display area 15b of the organic functional layer 157 may be provided with a packaging groove 157a surrounding by one round by laser etching. A basic process of laser etching is to focus a low-power laser beam with high beam quality (for example, may be ultraviolet laser, fiber laser, or the like) into an extremely small light spot, and form an extremely high power density at the focus, so that a material of the non-display area 15b of the organic functional layer 157 vaporizes and evaporates instantly, to form the packaging groove 157a. Laser etching has a small heat affected zone, can ablate the machining area quite accurately, has an extremely high machining accuracy and machining quality, and therefore can etch the packaging groove 157a having an extremely small width. For example, the packaging groove 157a having a width between 10 μm and 50 μm may be obtained by etching. As stated above, the width of the packaging groove 157a on the side away from the substrate 159 may be within the width range, and the width of the packaging groove 157a on the side close to the substrate 159 may also be within the width range. Moreover, because the laser etching can focus into an extremely small light spot at a laser wavelength level, the organic functional layer 157 can be completely etched away, and even the buffer layer 163 below the organic functional layer 157 may be partially or completely etched away, which is beneficial to the filling of the packaging layer 153 in step S34. In addition, the laser etching is suitable for processing a flexible material without contact with and contamination of the organic functional layer 157.

In step S33 of other embodiments, the packaging groove 157a may also be formed in other ways such as plasma beam dry etching or ion beam dry etching.

As shown in FIG. 17, the packaging groove 157a formed in step S33 and may have an approximately trapezoidal cross-sectional shape. The width of the packaging groove 157a on the side away from the substrate 159 is greater than the width of the packaging groove 157a on the side close to the substrate 159. The trapezoidal packaging groove 157a is beneficial to sufficient filling of the packaging layer 153 in step S34.

As shown in FIG. 17, in step S33, the packaging groove 157a may be provided to surround the outer circumference of the crack arrest groove 159a and be located between the barrier dam 168 and the crack arrest groove 159a. The packaging groove 157a may be provided at both the outer circumference and the inner circumference of the barrier dam 168.

Figure 18:
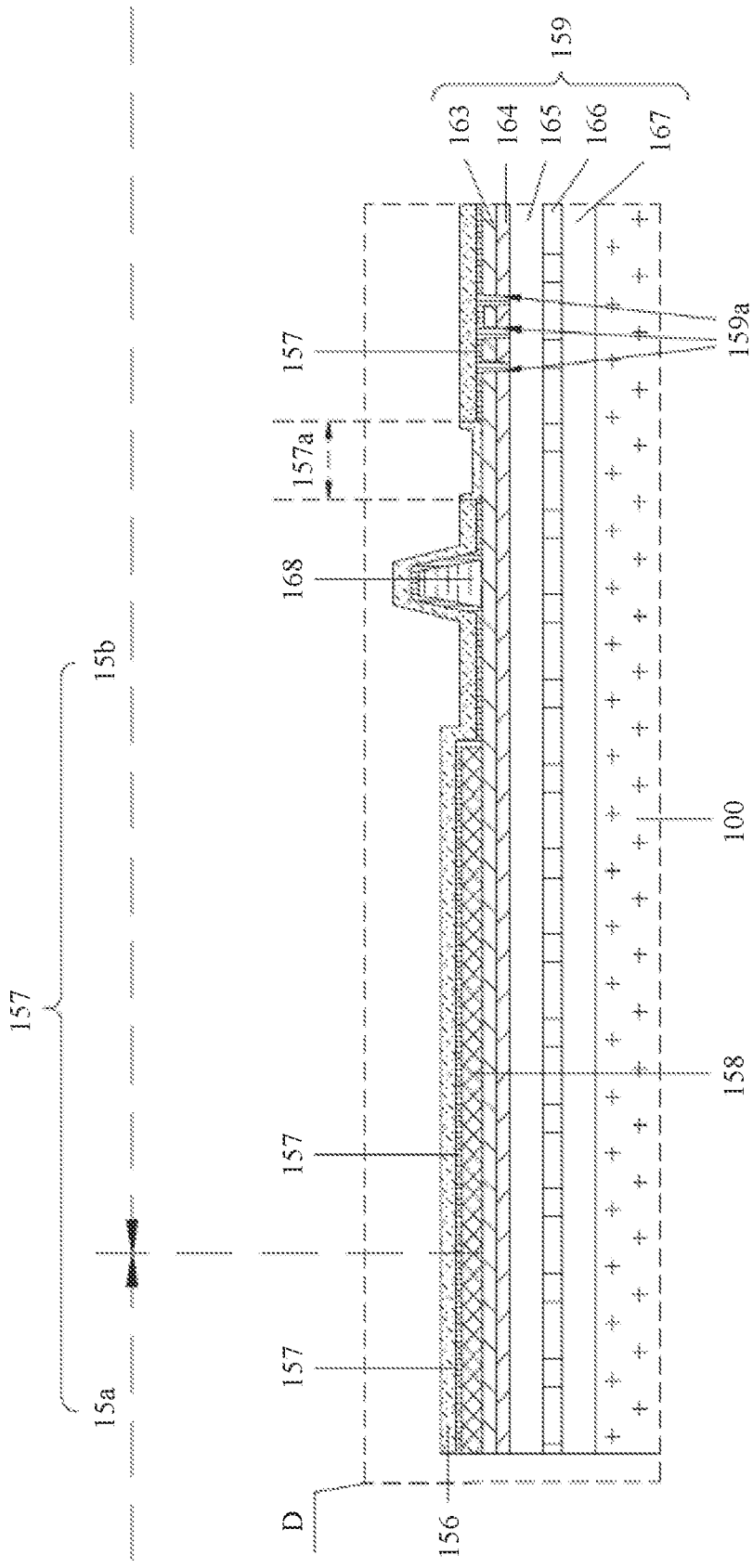
FIG. 18 is a schematic diagram of forming a first inorganic packaging layer on the organic functional layer according to Embodiment 2.
Figure 19:
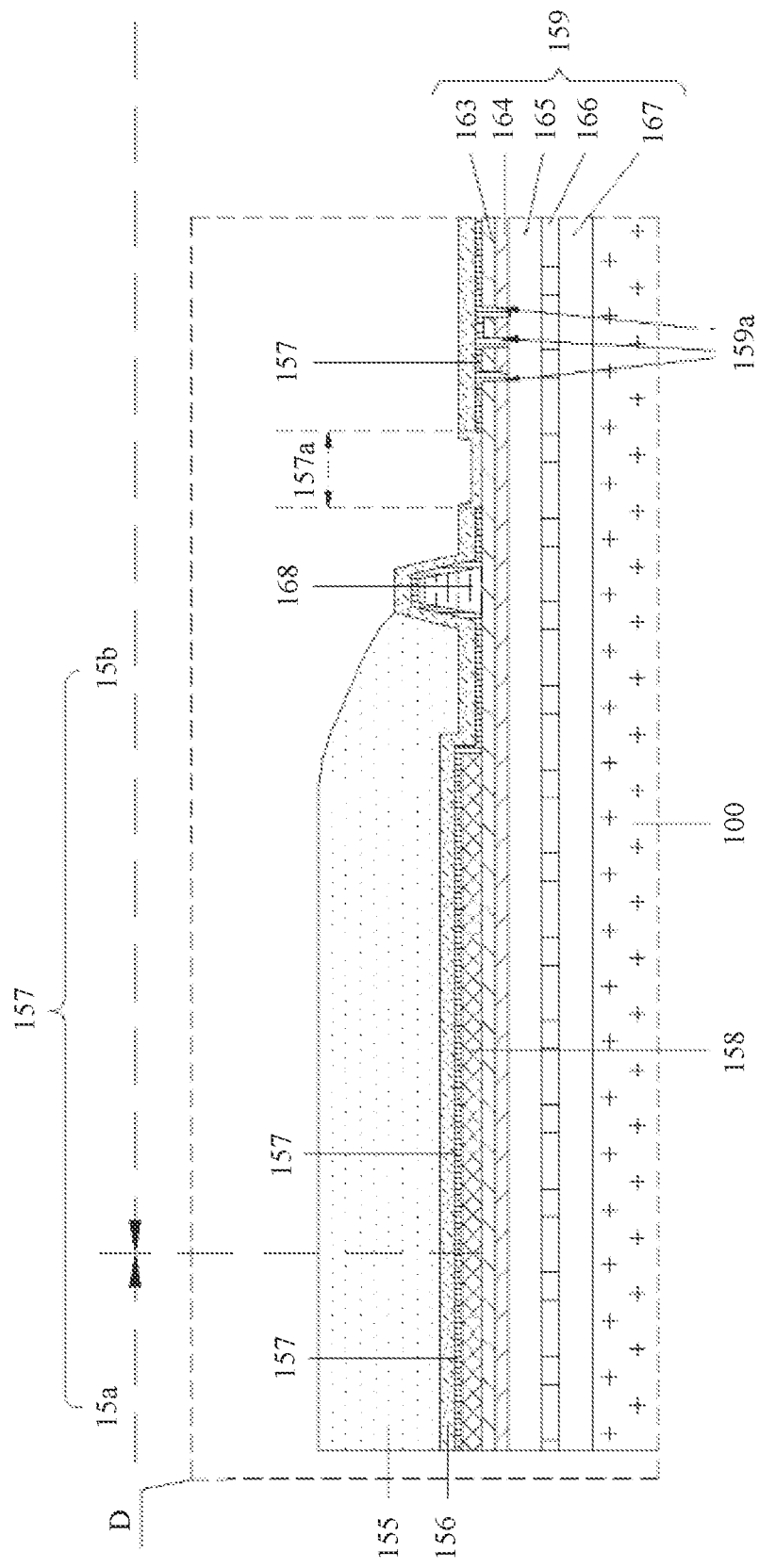
FIG. 19 is a schematic diagram of forming an organic packaging layer on the first inorganic packaging layer according to Embodiment 2.
Figure 20:
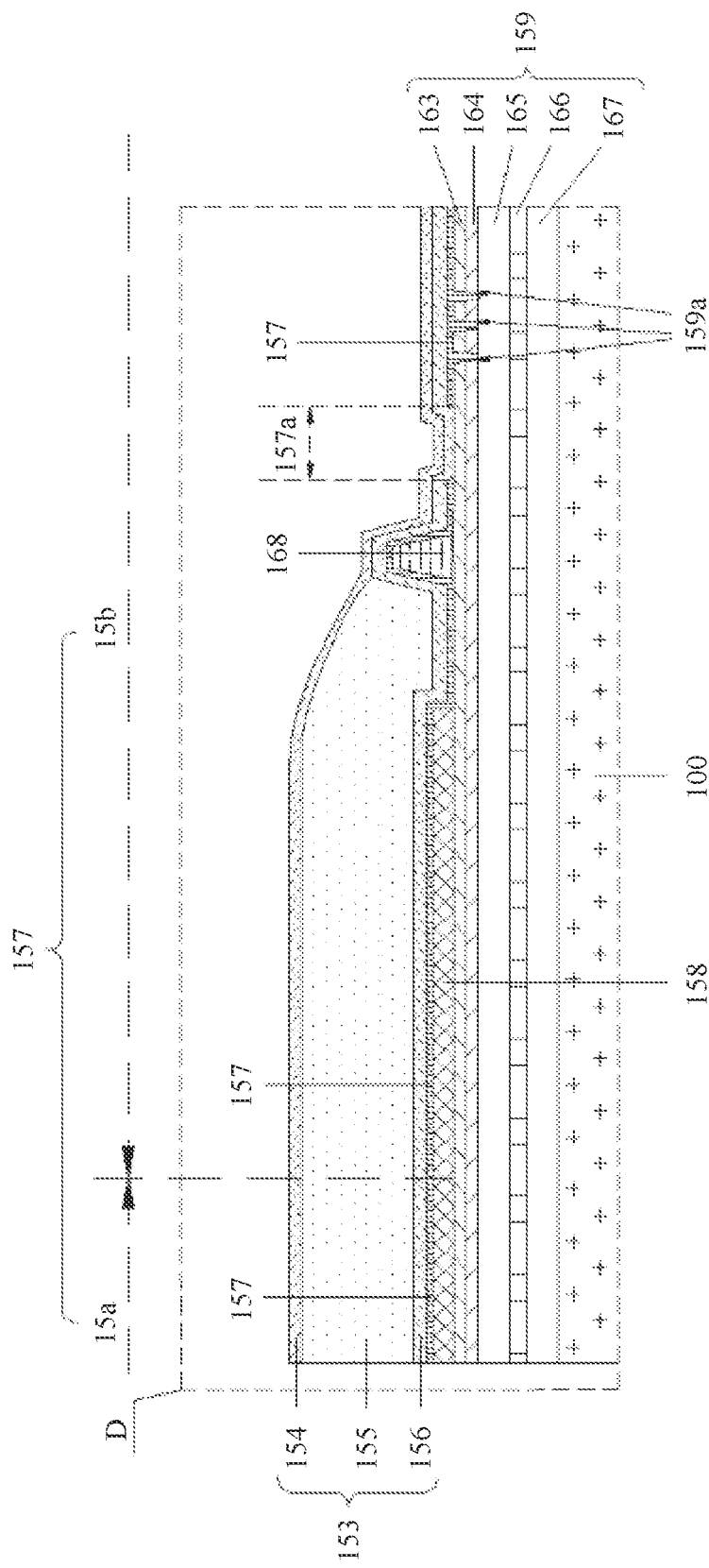
FIG. 20 is a schematic diagram of forming a second inorganic packaging layer on the first inorganic packaging layer and the organic packaging layer according to Embodiment 2.

As shown in FIG. 18 to FIG. 20, step S34 may specifically include the following steps.

S341: As shown in FIG. 18, a first inorganic packaging layer 156 is formed on the organic functional layer 157, so that the first inorganic packaging layer 156 covers the display area 15a and the non-display area 15b of the organic functional layer 157 and is filled in the packaging groove 157a. The first inorganic packaging layer 156 covers the entire area of the organic functional layer 157 and is filled in the packaging groove 157a to partition the organic functional layer 157. The part of the first inorganic packaging layer 156 filled in the packaging groove 157a may be in contact with the buffer layer 163. For example, the first inorganic packaging layer 156 may be manufactured by depositing an inorganic material of SiNx and/or SiO2 on the organic functional layer 157 through a low temperature CVD process or an ALD process. The foregoing process is suitable for deposition of an inorganic material, with a good yield and a high process reliability.

S342: As shown in FIG. 19, an organic packaging layer 155 is formed on the first inorganic packaging layer 156, so that the organic packaging layer 155 covers a part of the first inorganic packaging layer 156 located on the outer circumference of the barrier dam 168. For example, an organic material such as an epoxy resin or a polymethyl methacrylate may be printed onto the first inorganic packaging layer 156 through an ink jet printing process. The organic material has fluidity, and the barrier dam 168 can block the organic material, so as to cover the area of the first inorganic packaging layer 156 located in the outer circumference of the barrier dam 168. After covering is complete, the organic material may be cured, to obtain the organic packaging layer 155. The ink jet printing process is suitable for deposition of an organic material, with a good yield and a high process reliability. The organic packaging layer 155 may also be formed by another process, for example, an ODF process.

S343: As shown in FIG. 20, a second inorganic packaging layer 154 is formed on the organic packaging layer 155 and the first inorganic packaging layer 156. For example, the second inorganic packaging layer 154 may be manufactured by depositing an inorganic material of SiNx and/or SiO2 on the organic packaging layer 155 and the first inorganic packaging layer 156 through a low temperature CVD process or an ALD process. The foregoing process is suitable for deposition of an inorganic material, with a good yield and a high process reliability.

The packaging layer 153 may be manufactured through step S341 to step S343. The packaging layer 153 manufactured by the process has a good flexibility and water and oxygen barrier performance.

Figure 21:
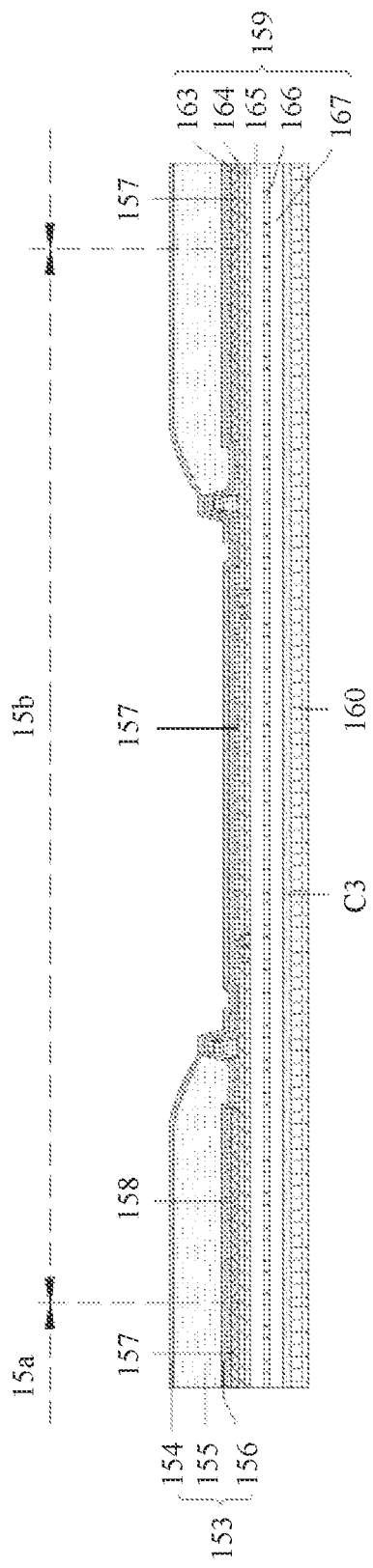
FIG. 21 is a schematic diagram of lifting off a rigid carrier plate and attaching a back film according to Embodiment 2.

As shown in FIG. 21, after the packaging layer 153 is manufactured in step S34, the rigid carrier plate 100 may be lifted off to facilitate subsequent continuation of the manufacturing process. For example, the rigid carrier plate 100 may be separated from the first organic polymer material layer 167 through a laser lift off (LLO) process. After the rigid carrier plate 100 is lifted off, a back film 160 may be attached to a surface of the first organic polymer material layer 167 facing away from the first isolation layer 166, and the back film 160 may be laminated to the first organic polymer material layer 167 through an adhesive layer C3.

Figure 22:
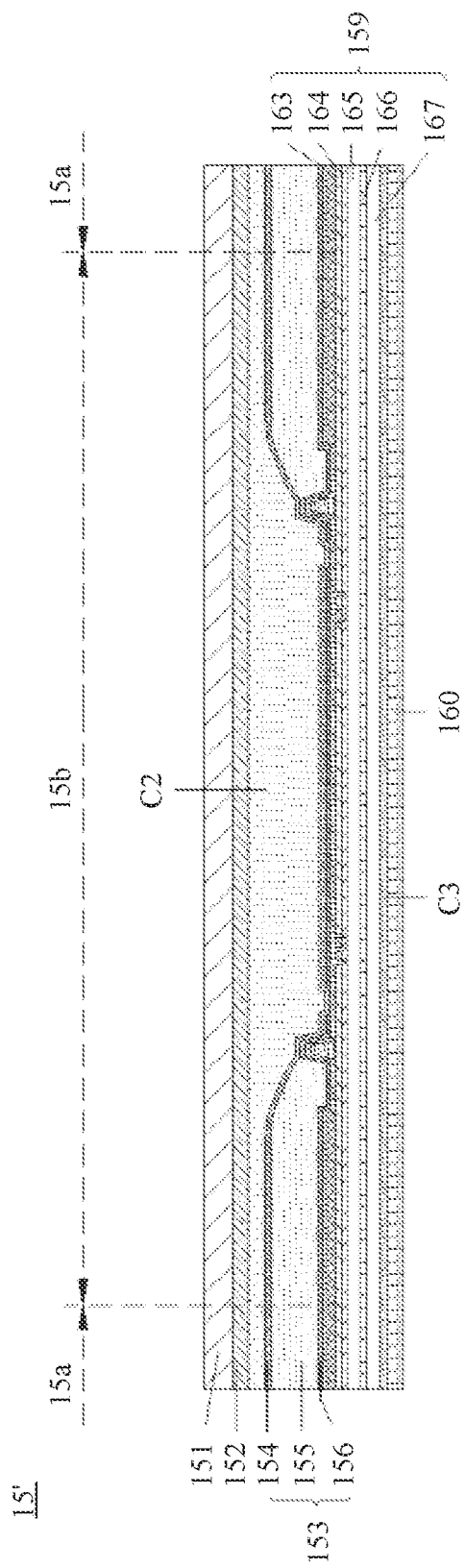
FIG. 22 is a schematic diagram of laminating a touch layer and a polarizing layer on the packaging layer according to Embodiment 2.

As shown in FIG. 22, after lifting off the rigid carrier plate 100, in step S35, a touch layer 152 and a polarizing layer 151 may be formed on the packaging layer 153. The polarizing layer 151 is the polarizer 151. For example, the touch layer 152 may be laminated to the packaging layer 153 through an adhesive layer C2 and the polarizing layer 151 covers the touch layer 152. The polarizing layer 151 and the touch layer 152 may be integrated without being bonded by a medium. In this case, an integrated film layer of the polarizing layer 151 and the touch layer 152 may be laminated to the packaging layer 153. Alternatively, the polarizing layer 151 and the touch layer 152 may be independent films, and the touch layer 152 may be first laminated to the packaging layer 153, and then the polarizing layer 151 may be laminated to the touch layer 152. Alternatively, the touch layer 152 may be integrated with the packaging layer 153, that is, the touch layer 152 may be formed together in the manufacturing process of the display panel 15. In this case, only a separate polarizing layer 151 (or the polarizer 151) needs to be laminated to the touch layer 152.

Alternatively, in step S35 of other embodiments, after the touch layer 152 is formed in any of the above methods, the polarizing layer 151 may be formed on the touch layer 152 through a coating process (coating), and the polarizing layer 151 is integrated with the touch layer 152. Such the polarizing layer 151 may be referred to as a coated polarizer. The coating process can be used to prepare a relatively thin coated polarizer, which is beneficial to thinning of the display panel 15.

In other embodiments, when the coated polarizer is prepared through the coating process in step S35, step S35 may be performed first to manufacture the coated polarizer, and then the steps of lifting off the rigid carrier plate 100 and the attaching the back film 160 are performed. Alternatively, in other embodiments, when the TFT backplane 150 to be formed is a rigid backplane, the rigid carrier plate 100 may not be used and naturally the step of lifting off the rigid carrier plate 100 is not included.

As shown in FIG. 22, after the foregoing steps, a prefabricated panel 15' may be manufactured. In a next step, the prefabricated panel 15' is further processed.

Figure 23:
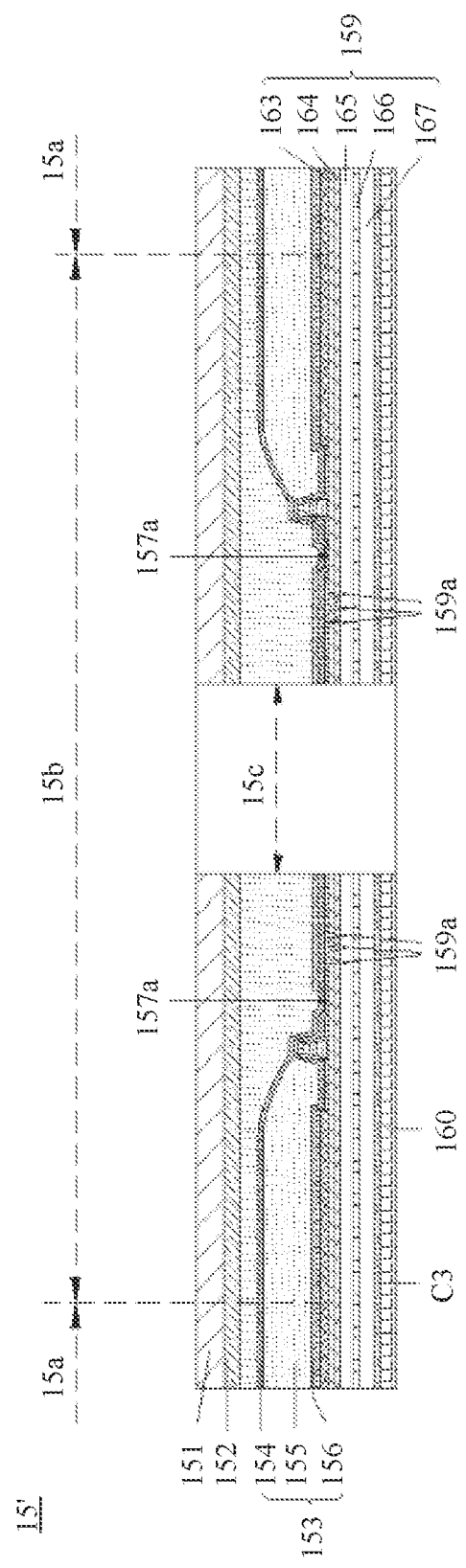
FIG. 23 is a schematic diagram of providing a through hole on a prefabricated panel according to Embodiment 2.
Figure 24:
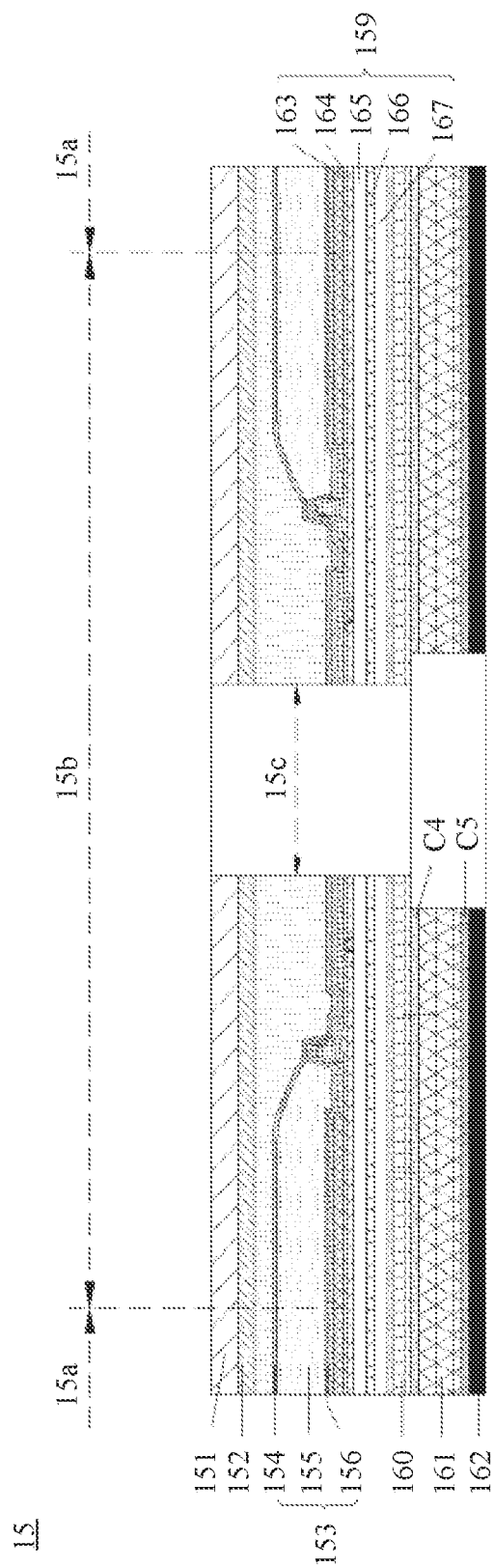
FIG. 24 is a schematic diagram of laminating a vibration damping layer and a support layer according to Embodiment 2.

As shown in FIG. 23, in step S36, a through hole 15c is provided in the prefabricated panel 15', and the through hole 15c is located on an inner circumference of the packaging groove 157a, for example, on the inner circumference of the crack arrest groove 159a. In step S36, the through hole 15c, the crack arrest groove 159a, and the packaging groove 157a are kept at an appropriate distance. An aperture of the through hole 15c is adapted to a size of the optical module 13. The through hole 15c may be provided in any suitable manner. As shown in FIG. 24, the vibration damping layer 161 and the support layer 162 may also be attached to a back portion of the prefabricated panel 15' after the through hole 15c is provided. For example, the vibration damping layer 161 may be attached to a surface of the back film 160 facing away from the substrate 159 through an adhesive layer C4, and the support layer 162 is attached to the vibration damping layer 161 through an adhesive layer C5. The vibration damping layer 161 may be made of a material having a cushioning and vibration absorbing performance, for example, foam. The support layer 162 may be made of copper foil, steel sheet (such as SUS stainless steel), or the like.

In other embodiments, the rigid carrier plate 100 may be lifted off after the through hole 15c is provided and then the vibration damping layer 161 and the support layer 162 are attached.

Figure 25:
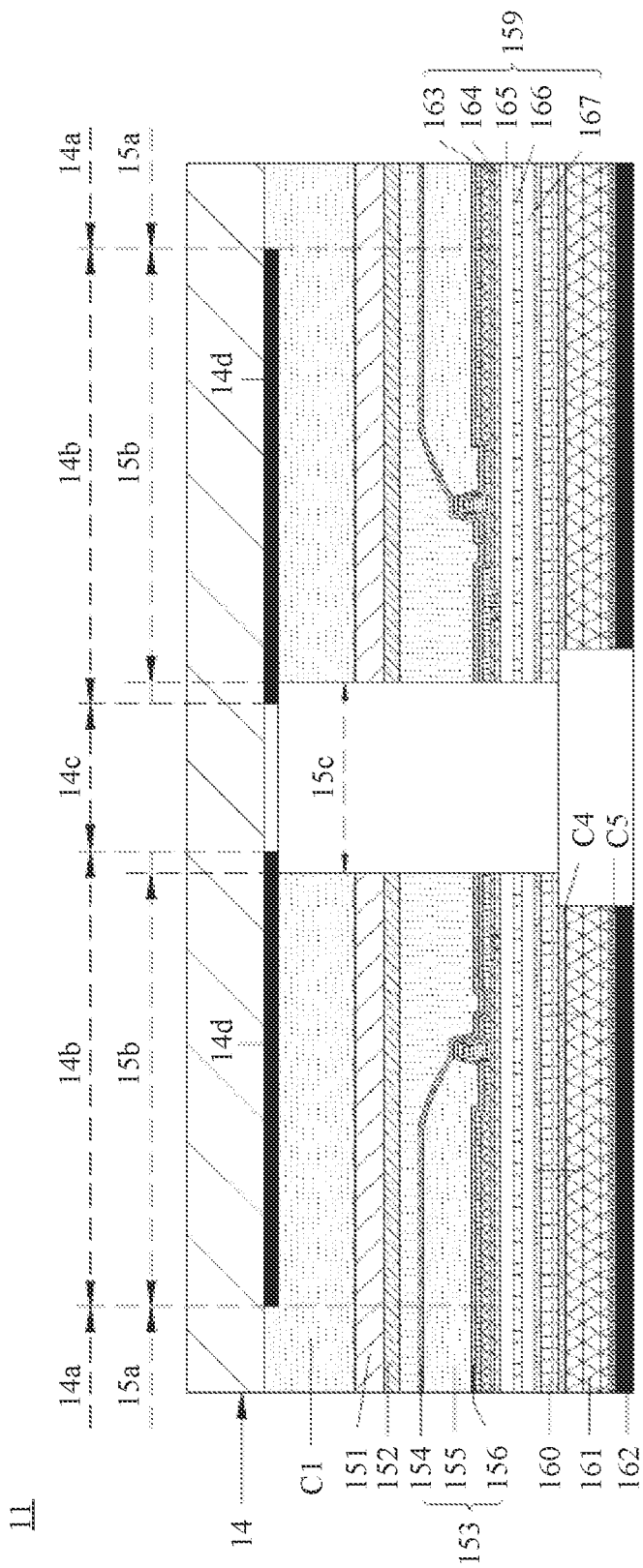
FIG. 25 is a schematic diagram of laminating a display panel and a cover plate according to Embodiment 2.

As shown in FIG. 25, the display panel 15 and the cover plate 14 manufactured by the foregoing manufacturing method may be laminated by an adhesive layer C1 to obtain the display screen 11. The cover plate 14 may include a first transparent area 14a, an opaque area 14b, and a second transparent area 14c. The opaque area 14b of the cover plate 14 is provided with light-shielding ink 14d. The through hole 15c of the display panel 15 may positionally correspond to the second transparent area 14c of the cover plate 14, the non-display area 15b of the display panel 15 may positionally correspond to the opaque area 14b, and the display area 15a of the display panel 15 may positionally correspond to the first transparent area 14a, or a bare cover plate may be used to be laminated to the display panel 15. The bare cover plate is not coated with the light-shielding ink 14d, the entire area of the bare cover plate is transparent, and there is no opaque area 14b. Before laminating, the light-shielding ink 14d may be applied to a set area on the bare cover plate in advance, to divide the bare cover plate into a first transparent area 14a, an opaque area 14b, and a second transparent area 14c, where the opaque area 14b is an area on which the light-shielding ink 14d is applied. The bare cover plate coated with the light-shielding ink 14d is then laminated to the display panel 15. By comparing the above two processes, it can be seen that the former is to directly laminate the cover plate 14 having the opaque area 14b to the display panel 15; and in the latter case, the bare cover plate without an opaque area 14b is pre-processed, to form the opaque area 14b, and then laminated to the display panel 15.

In other embodiments, the bare cover plate which is transparent in the entire area can be directly configured to be laminated to the display panel 15, so that there is no problem of aligning the second transparent area 14c with the through hole 15c, and the process difficulty can be reduced. Moreover, the non-display area 15b in the manufactured display screen 11 is not shield, and therefore can be observed by a user, which can produce a unique appearance experience.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A display panel, comprising:
   a thin film transistor backplane;
   an organic layer; and
   a packaging layer, wherein the thin film transistor backplane, the organic layer, and the packaging layer are successively stacked;
   wherein the display panel is provided with a through hole, wherein runs through the thin film transistor backplane, the organic layer, and the packaging layer;
   wherein the display panel comprises a non-display area and a display area, the non-display area being disposed around the through hole and the display area being disposed around the non-display area;
   wherein the organic layer comprises a first organic layer and a second organic layer, the first organic layer is partially located in the display area, and the second organic layer is partially located in the non-display area, wherein the first organic layer comprises a plurality of display devices, the second organic layer is provided with a first groove that runs through the second organic layer, and the first groove is disposed around the through hole; and
   wherein the packaging layer covers the organic layer and is filled in the first groove.

2. The display panel according to claim 1, wherein a width of the first groove on a side closer to the packaging layer is greater than the width of the first groove on a side away from the packaging layer.

3. The display panel according to claim 1, wherein:
   the thin film transistor backplane comprises a substrate and a dam disposed on the substrate, wherein the dam is located in the non-display area and is disposed around the through hole;
   the organic layer covers the substrate and the dam, and the first groove is spaced apart from the dam; and
   the packaging layer comprises a first inorganic packaging layer, an organic packaging layer, and a second inorganic packaging layer, wherein the first inorganic packaging layer covers the organic layer and is filled in the first groove, the organic packaging layer covers a part of the first inorganic packaging layer located on an outer circumference of the dam, and the second inorganic packaging layer covers the organic packaging layer and the first inorganic packaging layer.

4. The display panel according to claim 3, wherein the first groove is provided in both inner and outer sides of the dam.

5. The display panel according to claim 1, wherein the width of the first groove on the side closer to the packaging layer is 10 μm-50 μm and the width of the first groove on the side away from the packaging layer is 10 μm-50 μm.

6. The display panel according to claim 3,
   wherein the substrate is provided with a second groove that forms an opening on a surface of the substrate facing the organic layer, wherein the second groove does not run through the substrate, and the second groove is located between the dam and the through hole and surrounds the through hole; and
   wherein the first groove is located on an outer circumference of the second groove.

7. The display panel according to claim 1, wherein the display panel comprises a touch layer that covers the packaging layer, and the through hole runs through the touch layer.

8. An electronic device, comprising:
an optical device; and
a display screen,
wherein the optical device corresponds to the through hole, and the optical device is configured to acquire a light ray passing through a transparent area and the through hole,
wherein the display screen comprises a cover plate and the display panel according to claim 1,
wherein the cover plate is laminated to the display panel, and
wherein the packaging layer is located between the cover plate and the organic layer.

9. The electronic device according to claim 8,
wherein the cover plate comprises a first transparent area, an opaque area, and a second transparent area;
wherein the first transparent area is disposed around the opaque area and the opaque area is disposed around the second transparent area; and
wherein the display area is located in the first transparent area, the opaque area corresponds to the non-display area, and the second transparent area corresponds to the through hole.

10. The electronic device according to claim 9, wherein a boundary of the opaque area and the second transparent area falls within a boundary of the through hole.

\* \* \* \* \*